(12) United States Patent
Turner et al.

(10) Patent No.: US 12,047,067 B2
(45) Date of Patent: Jul. 23, 2024

(54) LEVEL-CONVERSION CIRCUITS FOR SIGNALING ACROSS VOLTAGE DOMAINS

(71) Applicant: NVIDIA Corp., Santa Clara, CA (US)

(72) Inventors: Walker Joseph Turner, Jacksonville, FL (US); John Poulton, Chapel Hill, NC (US); Sanquan Song, Mountain View, CA (US)

(73) Assignee: NVIDIA CORP., Santa Clara, CA (US)

( * ) Notice: Subject to any disclaimer, the term of this patent is extended or adjusted under 35 U.S.C. 154(b) by 91 days.

(21) Appl. No.: 17/932,091

(22) Filed: Sep. 14, 2022

(65) Prior Publication Data

US 2024/0030918 A1    Jan. 25, 2024

Related U.S. Application Data

(63) Continuation-in-part of application No. 17/814,752, filed on Jul. 25, 2022, now Pat. No. 11,824,533.

(51) Int. Cl.
*H03K 19/0185* (2006.01)
*H03K 3/037* (2006.01)
*H03K 19/00* (2006.01)
*H03K 3/356* (2006.01)

(52) U.S. Cl.
CPC ..... *H03K 19/018521* (2013.01); *H03K 3/037* (2013.01); *H03K 19/0013* (2013.01); *H03K 19/018528* (2013.01); *H03K 3/356165* (2013.01)

(58) Field of Classification Search
CPC ......... H03K 19/018507–018528; H03K 3/037
See application file for complete search history.

(56) References Cited

U.S. PATENT DOCUMENTS

| | | | |
|---|---|---|---|
| 7,746,121 B2 | 6/2010 | Khoury et al. | |
| 11,824,533 B1* | 11/2023 | Turner | H03K 3/356191 |
| 2014/0218070 A1 | 8/2014 | Viani | |
| 2017/0093403 A1 | 3/2017 | Wilson et al. | |
| 2024/0030917 A1 | 1/2024 | Turner et al. | |
| 2024/0030918 A1 | 1/2024 | Turner et al. | |

OTHER PUBLICATIONS

J. M. Wilson et al., "A 6.5-to-23.3fJ/b/mm Balanced Charge-Recycling Bus in 16nm FinFET CMOS at 1.7-to-2.6GB/s/wire with Clock Forwarding and Low-Crosstalk Contraflow Wiring," IEEE International Solid-State Circuits Conference, vol. 59, pp. 156-157, Feb. 2016.

* cited by examiner

*Primary Examiner* — Patrick O Neill
(74) *Attorney, Agent, or Firm* — Rowan TELS LLC

(57) ABSTRACT

Stacked voltage domain level shifting circuits for shifting signals low-to-high or high-to-low include a storage cell powered by a mid-range supply rail of the stacked voltage domain level shifting circuit, and control drivers powered by moving supply voltages generated by the storage cell, wherein the control drivers coupled to drive gates of common-source configured devices coupled to storage nodes of the storage cell.

22 Claims, 18 Drawing Sheets

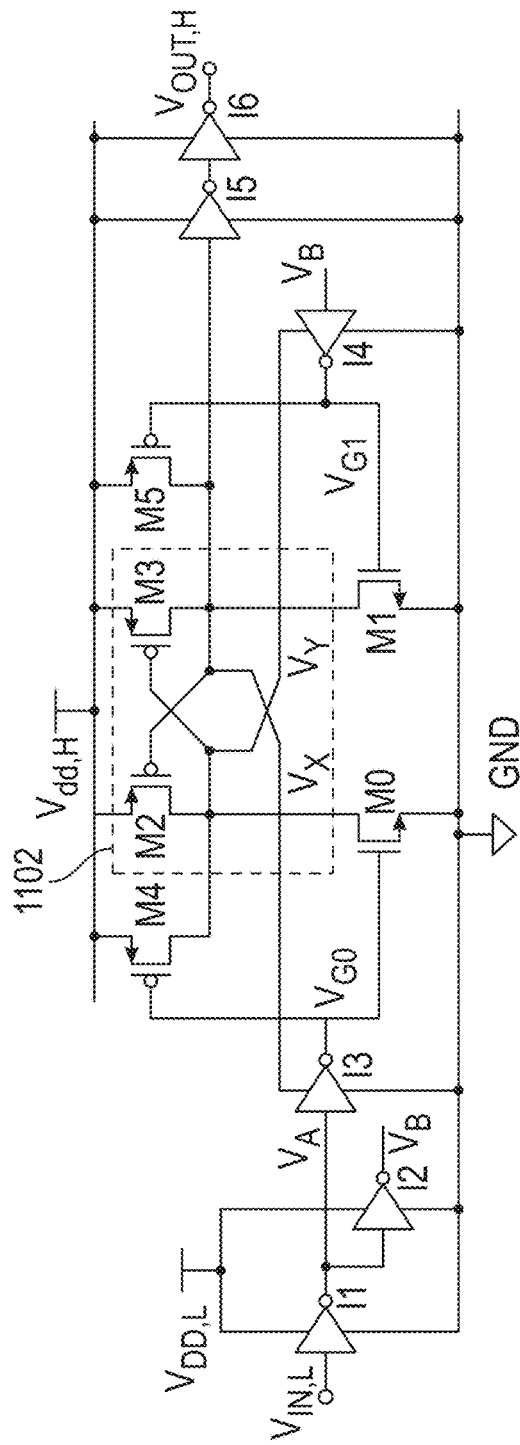
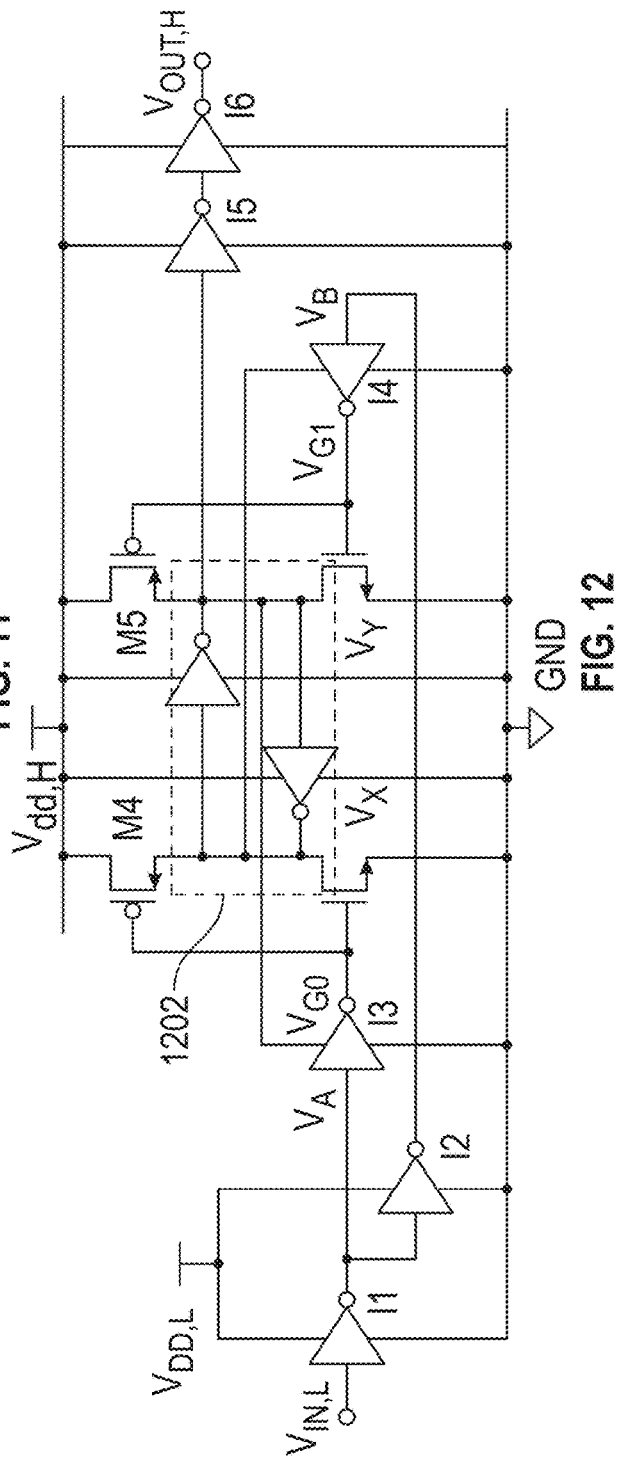
FIG. 11
FIG. 12

LEVEL-CONVERSION CIRCUITS FOR SIGNALING ACROSS VOLTAGE DOMAINS

CROSS REFERENCE TO RELATED APPLICATIONS

This application claims priority and benefit as a continuation-in-part of U.S. application Ser. No. 17/814,752, "LEVEL-CONVERSION CIRCUITS UTILIZING LEVEL-DEPENDENT INVERTER SUPPLY VOLTAGES", filed on Jul. 25, 2022, the contents of which are incorporated herein by reference in their entirety.

GOVERNMENT LICENSE RIGHTS

This invention was made with US Government support under LLNS subcontract B609487 (FastForward2 Node) awarded by DOE. The US Government has certain rights in this invention.

BACKGROUND

Voltage level conversion is utilized to propagate signals between circuits that are operating in different voltage domains, such as electronic interfaces and charge recycling fabrics. Conventional level conversion mechanisms utilize NMOS pull-down transistors or PMOS pull-up transistors to alter the logic state of a storage element, typically a latch, that is operating in the voltage domain of the output signal. The level conversion speed of conventional mechanisms is often constrained by the gate-to-source voltage (VGS) of the pull-down and/or pull-up transistors with respect to the magnitude of the lower supply voltage. This constrains the practical operational frequency range of such circuits.

Power saving techniques such as charge recycling data fabrics use stacked digital circuitry to transmit data within two-voltage domains (e.g., $V_{dd}$ and $V_{dd}/2$, and $V_{dd}/2$ and GND, where $V_{dd}$ represents circuit supply voltage and GND represents circuit ground). The transmitted signals may be level-converted between voltage domains to maintain charge balance on a non-regulated $V_{dd}/2$-level node.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 11 depicts an embodiment of a low-to-high signal level converter utilizing a storage cell 1102 comprising cross-coupled PMOS transistors.

FIG. 12 depicts an embodiment of a low-to-high signal level converter utilizing cross-coupled inverters for the storage cell 1202.

DETAILED DESCRIPTION

Figure 1:
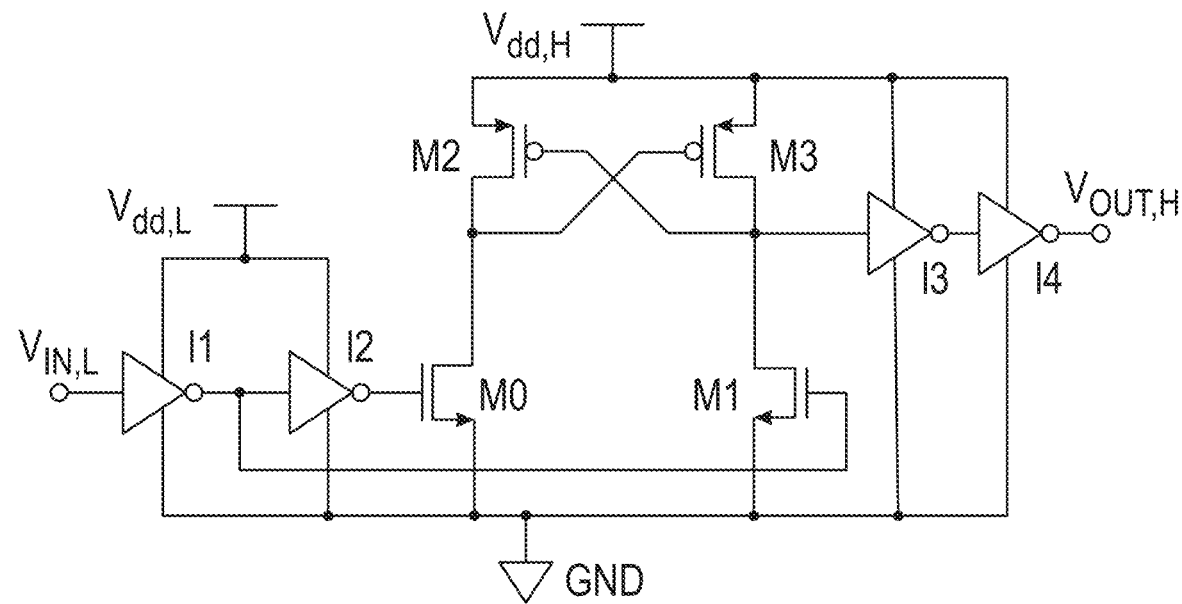
FIG. 1 depicts an embodiment of a level-shifting circuit for transitioning digital signals from a lower voltage domain to a higher voltage domain.

Disclosed herein are embodiments of circuitry for converting signal levels between low-to-high and high-to-low voltage domains within electronic interfaces and charge recycling implementations. These circuits increase the effective gate-to-source voltages (VGS) of pull-down and pull-up control transistors by utilizing PMOS and NMOS devices, respectively. Due to the complementary operation of these control transistors, the gate voltages may be set by inverters with moving supply voltages to increase the applied VGS while ensuring the control transistors are effectively switched off in the inactive state. A "moving supply voltage" is a dynamic (during circuit operation) change in the differential voltage between a power supply voltage applied (e.g., at a VDD terminal) to the circuit, and a circuit ground voltage applied (e.g., at a VSS terminal) of the circuit. The ground voltage may or may not be earth ground. The moving supply voltage to an inverter may be implemented by connecting either supply terminal (i.e., VDD terminal or VSS terminal) of the inverter to the source terminal of a control transistor.

Embodiments of the disclosed circuits may utilize PMOS and NMOS devices, respectively, as the pull-down and pull-up transistors to control a storage latch state, as opposed to conventional methods utilizing PMOS and NMOS devices as the pull-up and pull-down devices, respectively. This approach enables a gate-to-source voltage for the control transistors proportional to the full-scale voltage range of the circuit, increasing the level-conversion speed.

The disclosed mechanisms may be adopted within data links to increase the performance of low-power signaling techniques. For example, the mechanisms may be utilized within charge recycling fabrics where periodic swapping of signals between the high and low voltage domains is utilized to maintain charge balance on a non-regulated middle supply node. The mechanisms may also be adapted for utilization within conventional level conversion interfaces when transmitting signals between systems that operate at different supply voltages.

Herein, a transistor is referred to as a "pull-down" transistor if it operates as a bridge (via source-to-drain connection for a PMOS device or via a drain-to-source connection for an NMOS device) between a first circuit node configured to transition to a first voltage level and a second circuit node that is tied to a second, constant voltage level lower than the first voltage level. During circuit operation, the first voltage level may transition between a supply voltage level $V_{dd}$ and $V_{dd}/2$ (for example), and the second voltage level may remain constant at $V_{dd}/2$, for example. Or, the first voltage level may transition between $V_{dd}/2$ and a circuit ground level (GND, for example) and the second voltage level may be tied to GND.

Herein, a transistor is referred to as a "pull-up" transistor if it operates as a bridge (via source-to-drain connection for an NMOS device or via a drain-to-source connection for an PMOS device) between a first circuit node configured to transition to a first voltage level and a second circuit node that is tied to a second, constant voltage level higher than the first voltage level. The first voltage level may transition between approximately $V_{dd}/2$ and $V_{dd}$, for example, and the second voltage level may be tied to $V_{dd}$. Or, the first voltage level may transition between approximately circuit ground (GND) and approximately $V_{dd}/2$, and the second voltage level may be tied to $V_{dd}/2$, for example.

Herein circuits utilizing pull-down NMOS devices and/or pull-up PMOS devices are referred to as 'common-source switch configurations'. Circuits utilizing pull-up NMOS devices and/or pull-down PMOS devices are referred to as 'inverted source-follower configurations'.

Herein reference is made to a "moving supply voltage" for inverters. This refers to a supply node for the inverters (not an input node or output node) configured such that an applied voltage at the power supply or grounding node changes during operation. For example, a moving supply voltage may be provided to the inverters from an internal node of a larger circuit (as opposed to a supply voltage provided from a constant-value supply rail, specific examples of these being a $V_{dd}$ level supply rail and a $V_{dd}/2$ level supply rail).

FIG. 1 depicts a conventional level-shifting circuit for low-to-high signal level shifting. In other words, the circuit may be utilized to propagate signals from circuit domains operating from a lower supply voltage to a circuit domain operating from a higher supply voltage, without loss or corruption of the "logic level" of the signal (e.g., "1" or "0").

NMOS pull-down transistors (M0 and M1) are used to toggle the stored state within cross-coupled PMOS transistors (M2 and M3) powered by the higher supply voltage ($V_{dd,H}$). The gate voltages of M0 and M1 are controlled by inverters (I2 and I1 respectively) having constant supply voltages provided from the lower voltage domain ($V_{dd,L}$). This arrangement constrains the gate-to-source control voltages of the NMOS pull-down transistors to the range $V_{dd,L}$:0V. Because the NMOS devices have to overcome the positive feedback within the cross-coupled pair, whose VGS magnitude range is $V_{dd,H}$:0V, the level-conversion speed is constrained by the transistor threshold voltages and the ratio of $V_{dd,H}$ to $V_{dd,L}$ and may also be constrained by the size ratio between PMOS and NMOS devices utilized in the level-shifting circuit.

Figure 2:
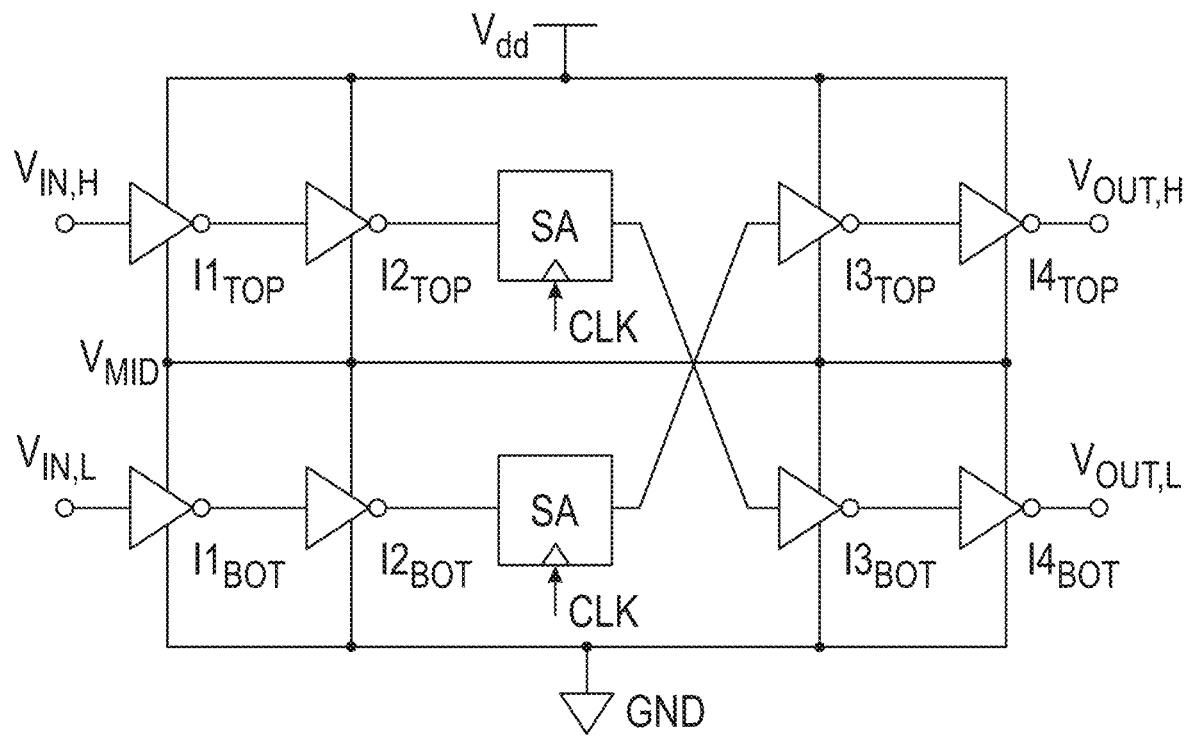
FIG. 2 depicts another embodiment of a level-shifting circuit for transitioning digital signals between voltage domains.

FIG. 2 depicts a charge recycling data link, where data signals are transitioned utilizing stacked inverters. The data signals are periodically swapped between supply voltage domains to maintain charge balance on the floating $V_{MID}$ node. So called "strong arm" (SA) latches, which are components familiar to those of skill in the art, operate at the full voltage range ($V_{dd}$ to GND) to latch and level-shift the half-swing data signals between the supply voltage domains.

Figure 3A:
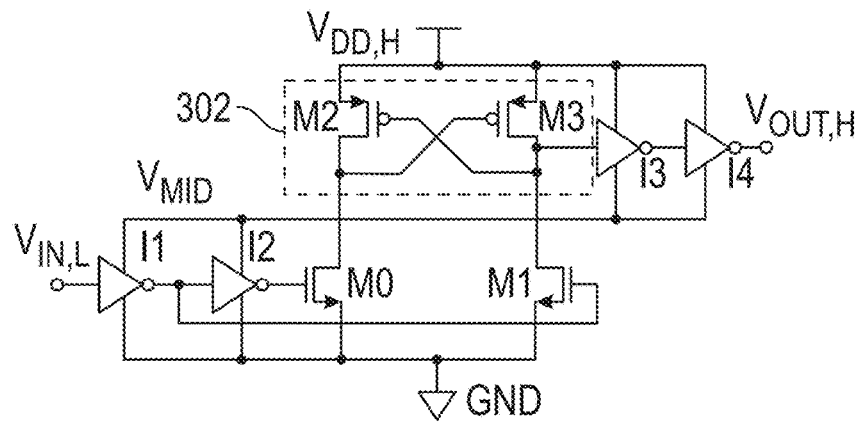
FIG. 3A and FIG. 3B depict charge recycling embodiments of a level-shifting circuit for transitioning digital signals from a lower voltage domain to a higher voltage domain and vice-versa, respectively.
Figure 3B:
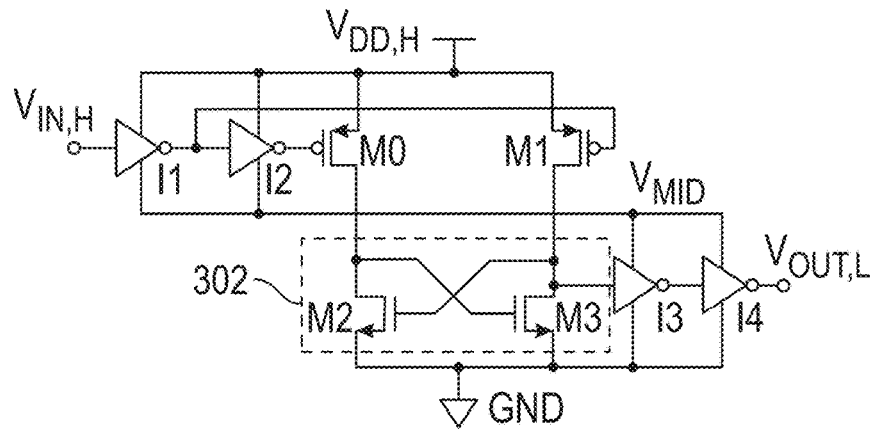

Other mechanisms may implement latches capable of providing fast level conversion speeds. FIG. 3A and FIG. 3B depict circuits that utilize storage cells 302 to latch internal state values to translate signals low-to-high and high-to-low between supply voltage domains, respectively. The level conversion speed of these mechanisms is restricted because a maximum VGS of $V_{dd}/2$ is applied to the pull-down and pull-up devices. A benefit of these mechanisms is that unlike the embodiment of FIG. 2, they do not utilize clocking to swap signals between voltage domains, saving power.

In other embodiments, the cross-coupled PMOS devices (FIG. 3A) or the cross-coupled NMOS devices (FIG. 3B) may be replaced by cross-coupled inverters.

Figure 4A:
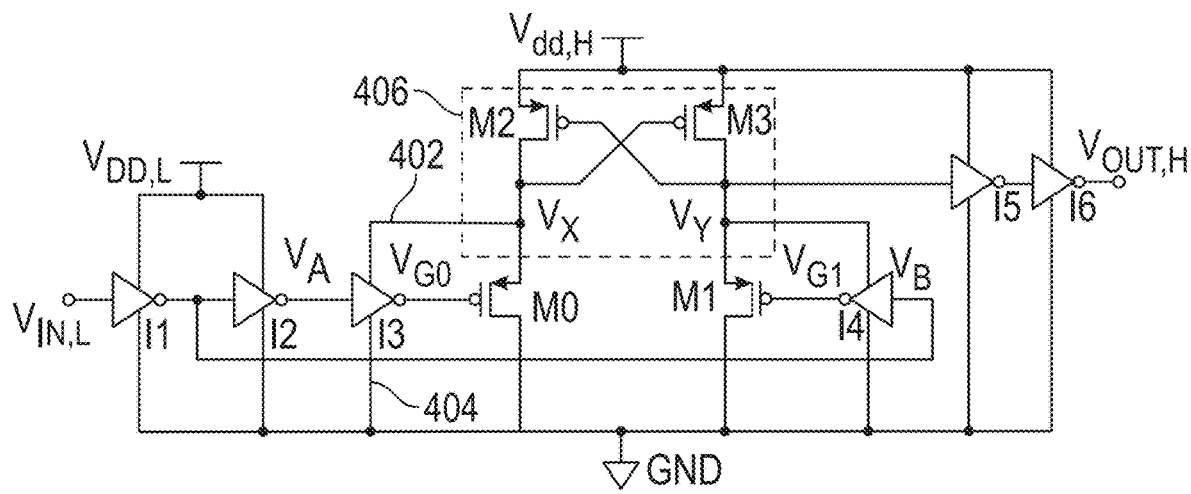
FIG. 4A and FIG. 4B depict an embodiment and waveforms, respectively, for a level-shifting circuit for transitioning digital signals from a lower voltage domain to a higher voltage domain.
Figure 4B:
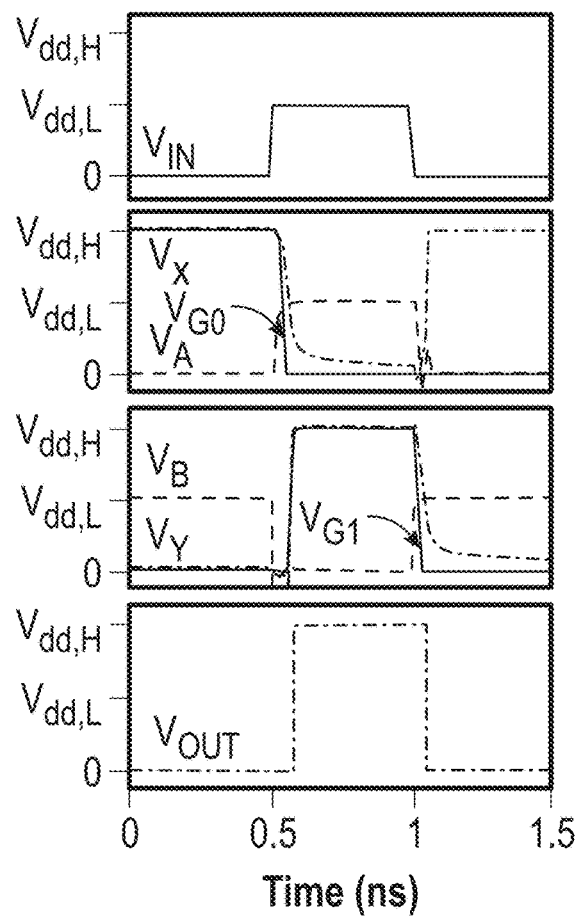

FIG. 4A and FIG. 4B depict a circuit embodiment and waveforms, respectively, for a low-to-high voltage domain level signal converter that addresses constraints of the conventional approaches. The circuit depicted in FIG. 4A applies PMOS transistors as pull-down devices (M0 and M1) to control the state of the cross-coupled PMOS storage elements (M2 and M3). The gate voltages of M0 and M1 are controlled by inverters I3 and I4, whose supply voltages are tied to the source of the respective pull-down device. The VDD terminal 402 and VSS terminal 404 of one of the control drivers (I3) are numbered for ease of reference. In the various figures, the gate voltages applied to pull-down or pull-up devices are referred to as $V_{G0}$ and $V_{G1}$. The supply voltage to the VDD terminal 402, which is the higher of the two supply potentials applied to the control drivers, is referred to herein as the "positive supply". The supply voltage to the VSS terminal 404, which is lower than the positive supply and may be 0V in some embodiments, is referred to herein as the "negative supply". In the exemplary embodiments described herein, the control drivers may be implemented as inverters, however those of skill in the art will appreciate that other types of gate driver circuits may be utilized instead.

The level converter comprises a storage cell 406 that stores internal state values $V_X$ and $V_Y$. Hereafter in this description, $V_X$ and $V_Y$ may refer to the internal state values manifested in the storage cell, or to the nodes of the storage cell at which these values manifest, depending on the context.

When the input signal $V_{IN,L}$ transitions to logic high ($V_{IN,L}$:$0V \rightarrow V_{dd,L}$ where $V_X = V_{dd,H}$, $V_Y \approx 0V$, and $V_{OUT,H} = 0V$), the gate of M0 is coupled to 0V through inverter I3 to apply a VGS ($V_X - V_{G0}$) of approximately $V_{dd,H}$. In this state, M0 sinks current to pull node $V_X$ towards $V_{dd,H}$. As 0V while the positive feedback within transistors M2 and M3 pull node $V_Y$ towards $V_{dd,H}$. As the intermediate signals transition, inverter I4 applies a control voltage ($V_{G1}$) to the gate of M1 that follows the $V_Y$ node such that a VGS of 0V is maintained to ensure the transistor remains off.

When the input signal $V_{IN,L}$ transitions to logic low ($V_{IN,L}$:$V_{dd,L} \rightarrow 0V$ where $V_X \approx 0V$, $V_Y = V_{dd,H}$, and $V_{OUT,H} = V_{dd,H}$), a VGS equal to 0V and $V_{dd,H}$, respectively, is applied to transistors M0 and M1, respectively, to pull node $V_Y$ towards 0V and to toggle the output $V_{OUT,H}$ to logic low (0V).

Figure 10A:
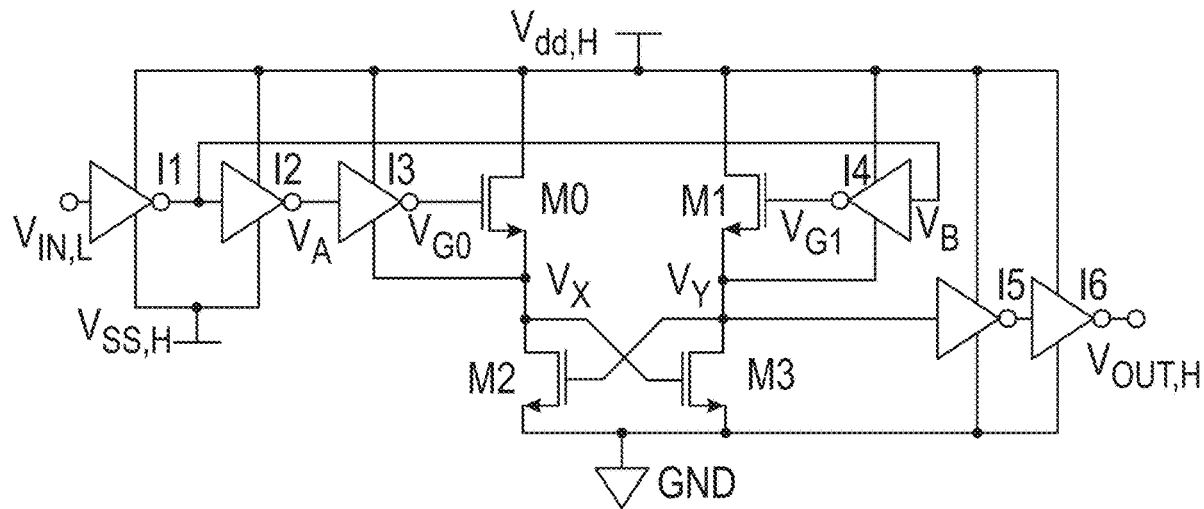
FIG. 10A and FIG. 10B depict an embodiment and waveforms, respectively, for a level-shifting circuit for transitioning digital signals from a higher ground voltage domain to a lower ground voltage domain.
Figure 10B:
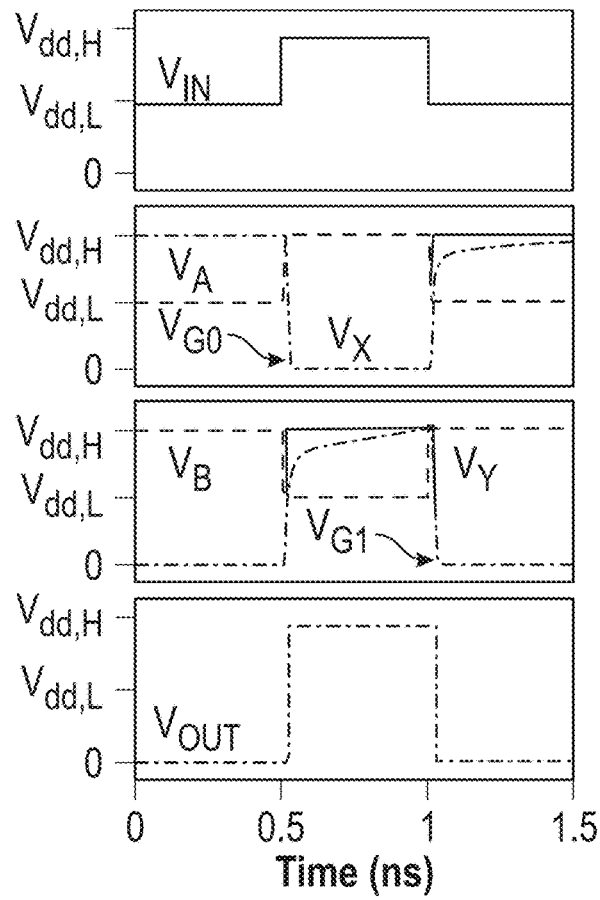

FIG. 10A and FIG. 10B depict an embodiment and waveforms, respectively, for a level-shifting circuit for transitioning digital signals from a higher ground voltage domain to a lower ground voltage domain. This embodiment is complementary to the one depicted in FIG. 4A. It will be readily apparent to those of skill in the art that a similar embodiment utilizing cross-coupled inverters could be implemented as per the teachings in FIG. 5A below.

In the embodiment of FIG. 4A, the pull-down transistors sink current to drive internal nodes $V_X$ and $V_Y$ toward 0V and to toggle the output signal state. However, as these internal nodes approach 0V, the VGS of the corresponding control transistor (M0 or M1) decreases, and the transistor is unable to pull the node voltage all the way to 0V. This inefficiency may be rectified by the circuit embodiment depicted in FIG. 5A, with corresponding waveforms depicted in FIG. 5B.

Figure 5A:
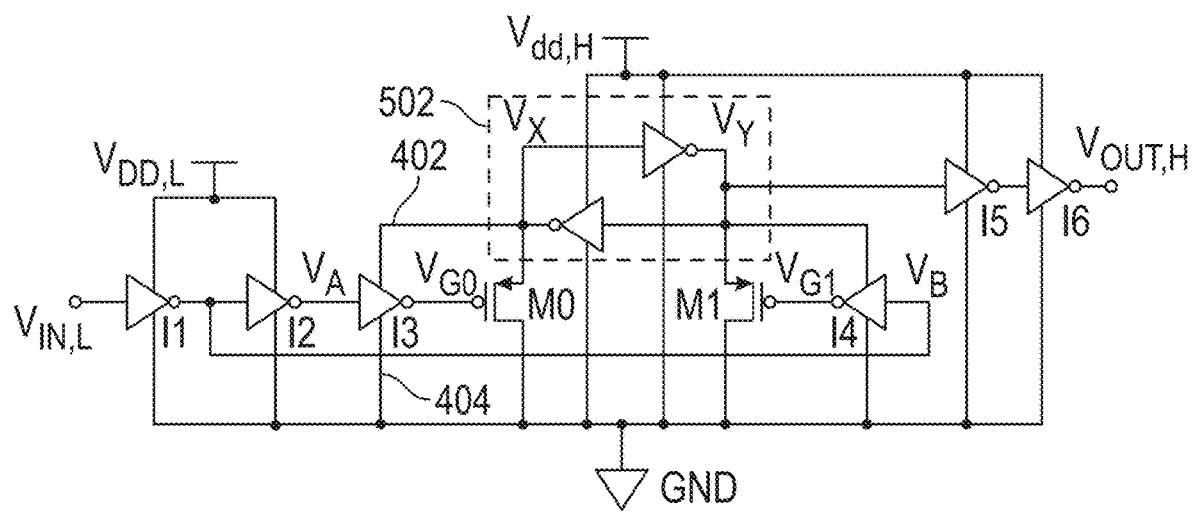
FIG. 5A and FIG. 5B depict another embodiment and waveforms for a level-shifting circuit for transitioning digital signals from a lower voltage domain to a higher voltage domain.
Figure 5B:
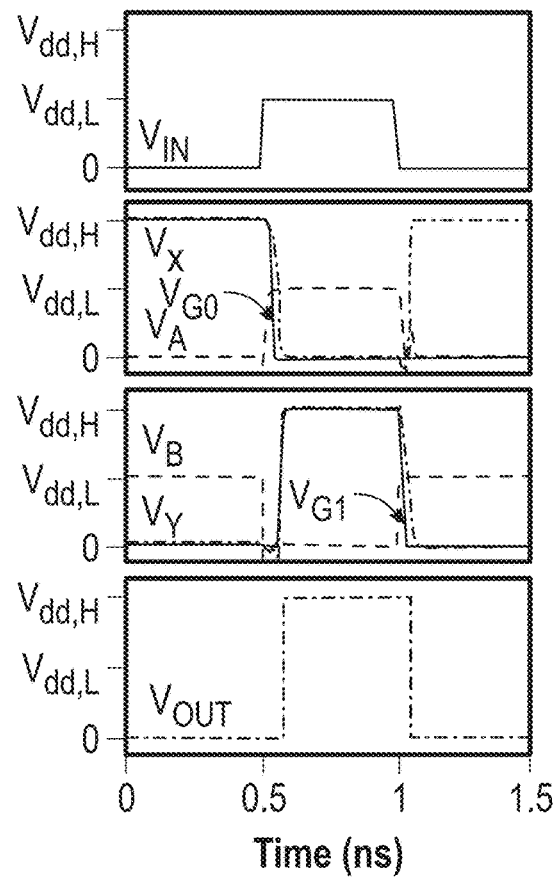

In the circuit of FIG. 5A, the storage cell 406 formed by transistors M2 and M3 has been replaced by a storage cell 502 comprising a pair of cross-coupled inverters that operate at the full $V_{dd,H}$ supply voltage. The NMOS devices (not depicted) that utilized internally within the cross-coupled inverters are set to a sufficiently small size such that a low impedance path is provided to GND, without substantially impairing the drive strength of the PMOS devices (not depicted) utilized within the cross-coupled inverters.

Figure 6A:
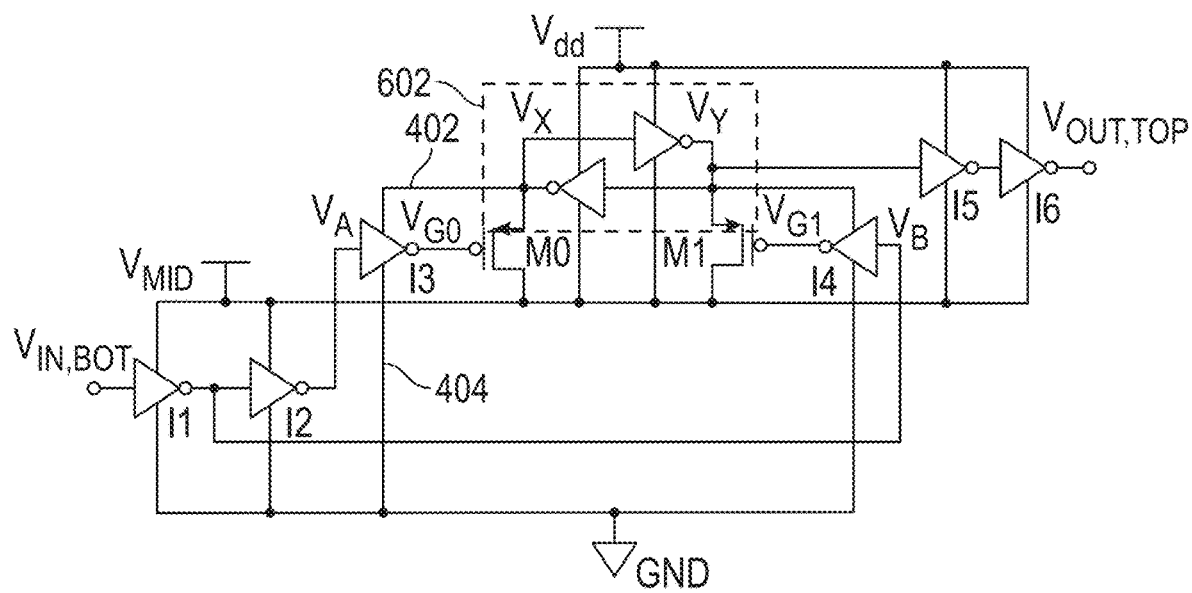
FIG. 6A and FIG. 6B depict another embodiment of a level-shifting circuit for transitioning digital signals from a lower voltage domain to a higher voltage domain.

FIG. 6A depicts an exemplary low-to-high level converter for use in a charge recycling data fabric. PMOS transistors are applied as pull-down transistors (M0 and M1). The drain connections of M0 and M1 are tied to a $V_{MID}$ supply rail set to a voltage $V_{dd}/2$. This restricts the voltage swing of the cross-coupled pair of inverters in the storage cell 602 to be between $V_{dd}$ and $V_{dd}/2$, and thus decrease level conversion time. Power consumption may also be reduced due to the reduction in the voltage swing at the cross-coupled nodes.

Herein, level-shifting circuits of this type that utilize a mid-range supply rail/node $V_{MID}$ are referred to as 'stacked voltage domain charge recycling circuits'. The upper range of the stacked voltage domains is ($V_{dd}$-$V_{MID}$) and the lower range of the stacked domains is ($V_{MID}$-GND).

Figure 6B:
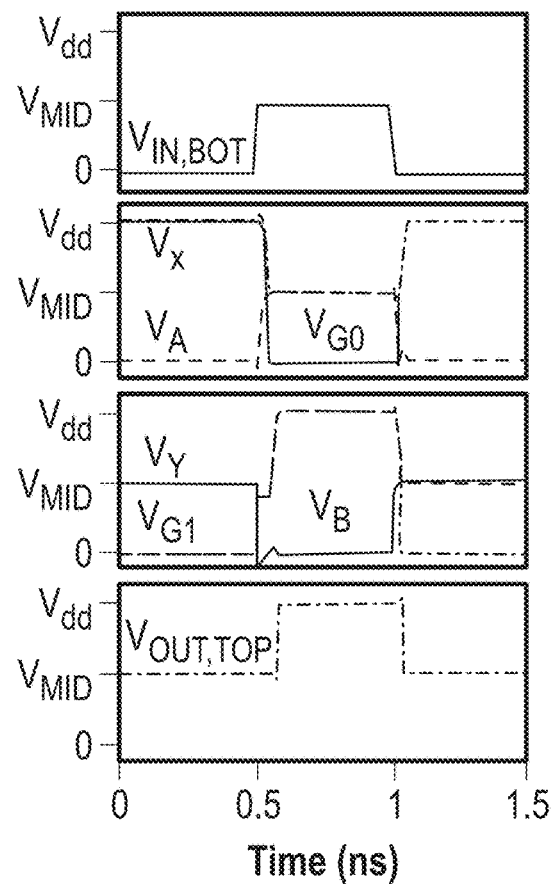

The gate voltages of pull-down transistors M0 and M1 are controlled by inverters I3 and I4, whose supplies are tied to internal nodes $V_X$ and $V_Y$. This means that the supply voltages of I3 and I4 shifts and the gate voltages of M0 and M1 switches to toggle or hold the latch state. Inverters I5 and I6 buffer the output signal between the $V_{dd}$ and $V_{MID}$ supply rails. Waveforms generated in the circuit of FIG. 6A are depicted in FIG. 6B.

Figure 7A:
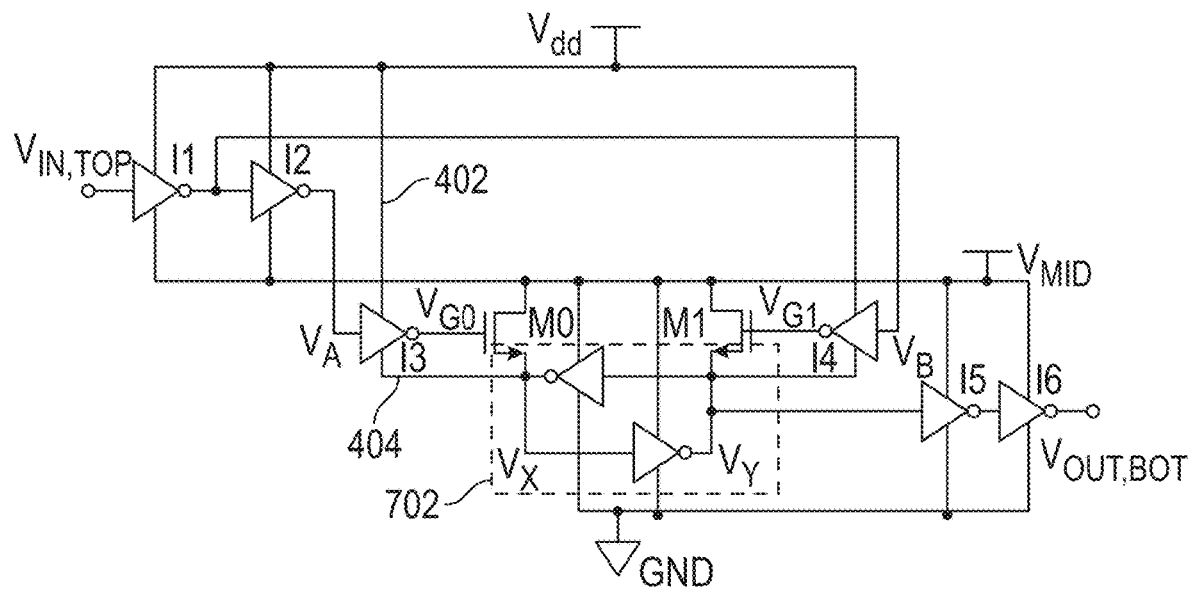
FIG. 7A and FIG. 7B depict an embodiment of a level-shifting circuit for transitioning digital signals from a higher voltage domain to a lower voltage domain.
Figure 7B:
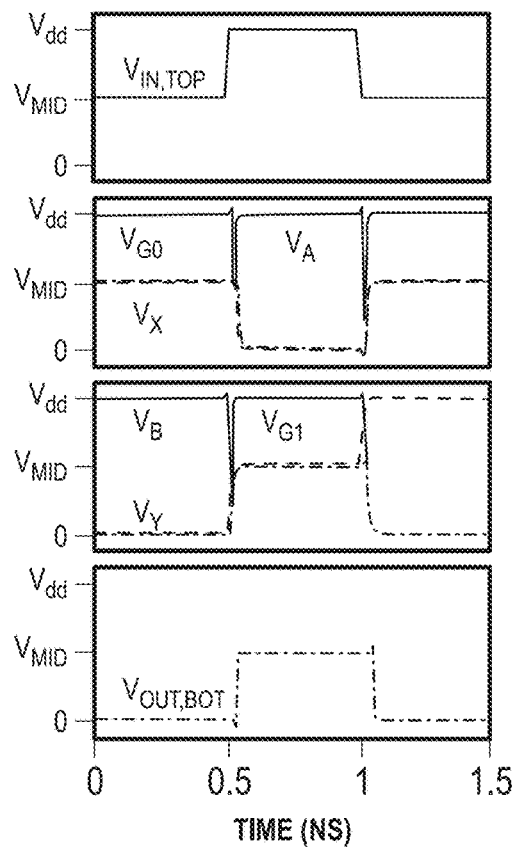

FIG. 7A depicts an exemplary high-to-low level converter for use in a charge recycling data fabric. This circuit embodiment complements the low-to-high level converter depicted in FIG. 6A. In the embodiment of FIG. 7A, NMOS transistors M0 and M1 are utilized as pull-up devices. The VDD terminal 402 and VSS terminal 404 connections of inverters I3 and I4 are tied to $V_{dd}$ and $V_X$ and $V_Y$ at the source terminals of control transistors M0 and M1, respectively. The cross-coupled inverter latch (storage cell 702) operates between $V_{dd}/2$ and GND. Gate voltages up to $V_{dd}$ are applied to M0 and M1 to toggle the latch state. The output signal passes through inverters I5 and I6 which buffer the signal with half-supply amplitudes between $V_{dd}/2$ and GND. Waveforms generated in the circuit of FIG. 7A are depicted in FIG. 7B.

Figure 8A:
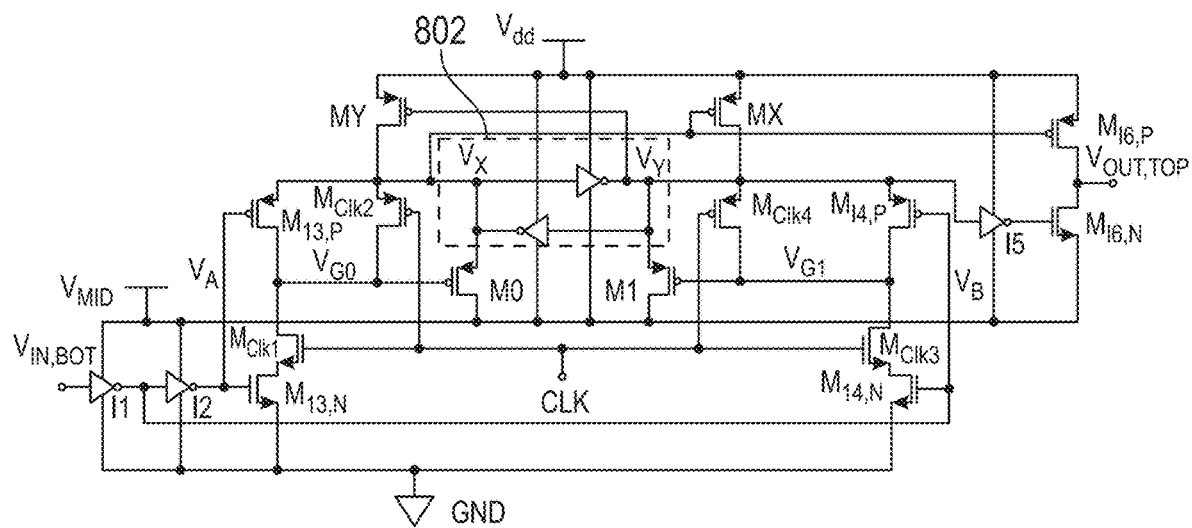
FIG. 8A and FIG. 8B depict an embodiment and waveforms for a level-shifting latch circuit for transitioning digital signals from a lower voltage domain to a higher voltage domain.
Figure 8B:
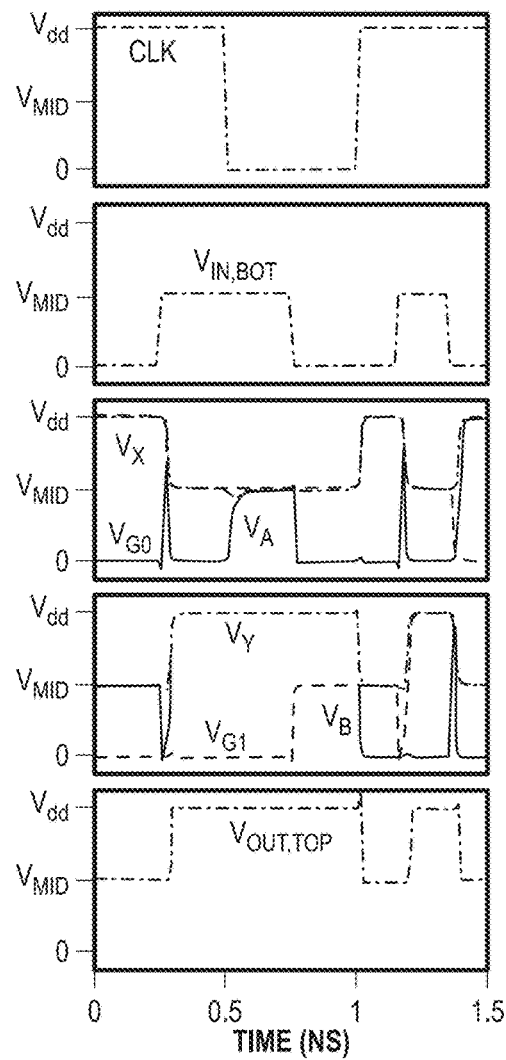

FIG. 8A and FIG. 8B depict a structure and corresponding waveforms for a low-to-high level-converting latch triggered by a falling edge of a full-scale clock (CLK) signal. The circuit uses a similar topology to the circuit in FIG. 6A with additional transistors to implement the functionality of a latch circuit (storage cell 802) and decrease signal transition time.

The clock signal (CLK) controls the gate connections of M0 and M1 (VG0 and VG1 respectively) through switching transistors $M_{Clk1}$, $M_{Clk2}$, $M_{Clk3}$, and $M_{Clk4}$. When the clock signal is high (CLK=$V_{dd}$), $M_{Clk1}$ and $M_{Clk3}$ are switched ON to activate the pull-down paths within the moving supply inverters (the inverters implemented by the transistor pairs $M_{I3,P}$, $M_{I3,N}$ and $M_{I4,P}$, $M_{I4,N}$ respectively).

In this state, the latch is transparent. Signal level transitions at the input $V_{IN,BOT}$ alter the cross-coupled latch state through pull-down transistors M0 and M1. When the clock signal transitions low (CLK: $V_{dd} \rightarrow 0V$), the NMOS transistors of the moving supply inverters are disconnected while $V_{G0}$ and $V_{G1}$ are shorted to nodes $V_X$ and $V_Y$ respectively through transistors $M_{Clk2}$ and $M_{Clk4}$.

In this state, the latch is opaque and the cross-coupled inverters of the storage cell 802 maintain the stored state. PMOS transistors $M_X$ and $M_Y$ (which need not be present in some embodiments) operate as pull-up switches, controlled by nodes $V_X$ and $V_Y$ respectively, to source additional current at the opposing nodes during signal transitions, and to decrease input-to-output signal propagation time. The NMOS and PMOS gate connections of the output inverter (the inverter implemented by the transistor pairs $M_{I6,P}$, $M_{I6,N}$) are separated and controlled by nodes $V_Y$ and $V_X$, respectively.

The gate of $M_{I6,P}$ is connected to node $V_X$ while the gate of $M_{I6,N}$ is buffered through inverter I5. This ensures the proper signal logic while enabling the capacitive loads at the $V_X$ and $V_Y$ nodes to be balanced for symmetric operation. Optionally, in another embodiment, the gate of $M_{I6,P}$ may be coupled to the output of inverter I5.

Figure 9A:
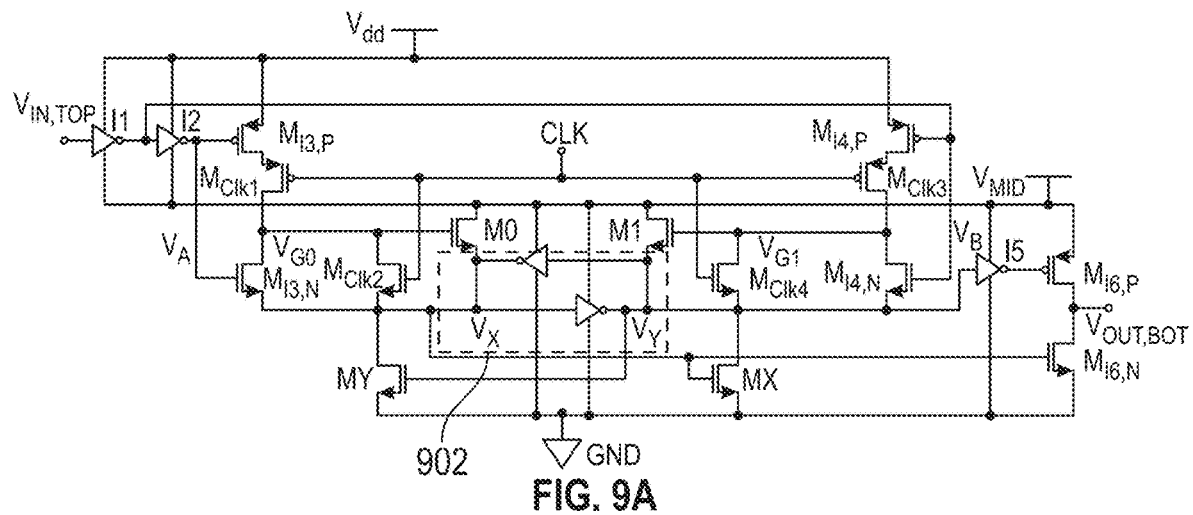
FIG. 9A and FIG. 9B depict another embodiment of a level-shifting latch circuit for transitioning digital signals from a higher voltage domain to a lower voltage domain.
Figure 9B:
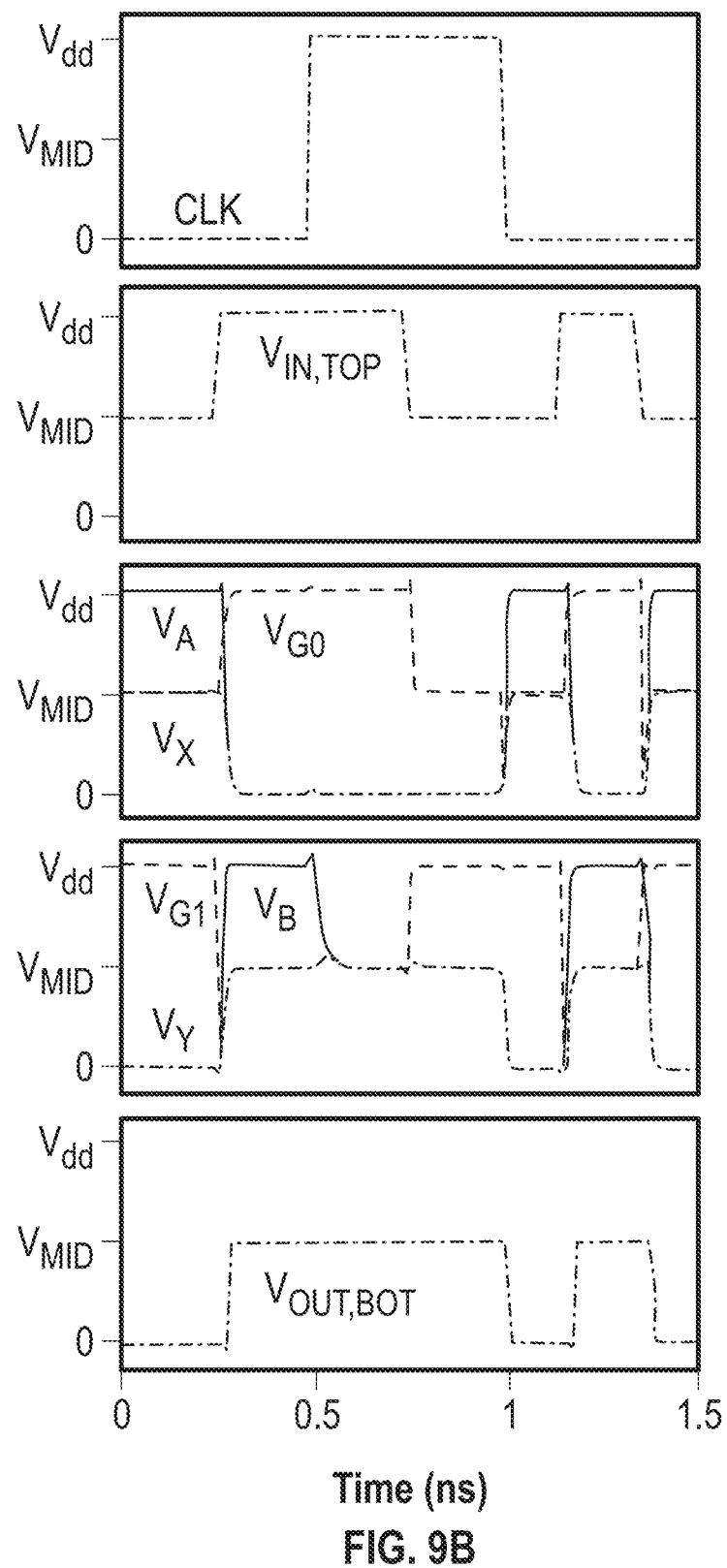

FIG. 9A and FIG. 9B depict a circuit embodiment and corresponding waveforms for a high-to-low level-converter comprising a latch (storage cell 902) triggered by a rising edge of a full-scale CLK signal. This circuit is complementary to the embodiment depicted in FIG. 8A. Its complementary operation may be readily understood in view of the description of FIG. 8A above.

Additional embodiments of level shifting circuits are described below in conjunction with FIG. 11 through FIG. 27. In view of the signal waveforms provided for the embodiments described thus far, the signal waveforms for these additional embodiments will be readily apparent to those of skill in the art.

FIG. 11 depicts an embodiment of a low-to-high signal level converter utilizing a storage cell 1102 comprising cross-coupled PMOS transistors M2 and M3. This embodiment utilizes control drivers I3 and I4 with moving supply voltages $V_Y$ and $V_X$. Instead of utilizing PMOS pull-down devices, this embodiment utilizes NMOS pull-down transistors (M0 and M1) and PMOS pull-up transistors (M4 and M5) to toggle the storage stage. This embodiment is therefore an example of a common-source switch configuration.

The inverters I3 and I4 enable VGS=$V_{dd,H}$-0V to be applied to both the PMOS pull-up and NMOS pull-down toggling transistors, which both provide low impedances to either $V_{dd,H}$ or GND, respectively.

FIG. 12 depicts an embodiment of a low-to-high signal level converter utilizing cross-coupled inverters for the storage cell 1202 instead of cross-coupled PMOS transistors, thereby providing additional pull-down impedances in the positive feedback storage element formed by the cross-coupled devices. This provides a pull-down path in the cross-coupled storage element and has a similar effect as adding cross-coupled NMOS devices to the embodiment of FIG. 11. This embodiment is another example of a common-source switch configuration.

Figure 13:
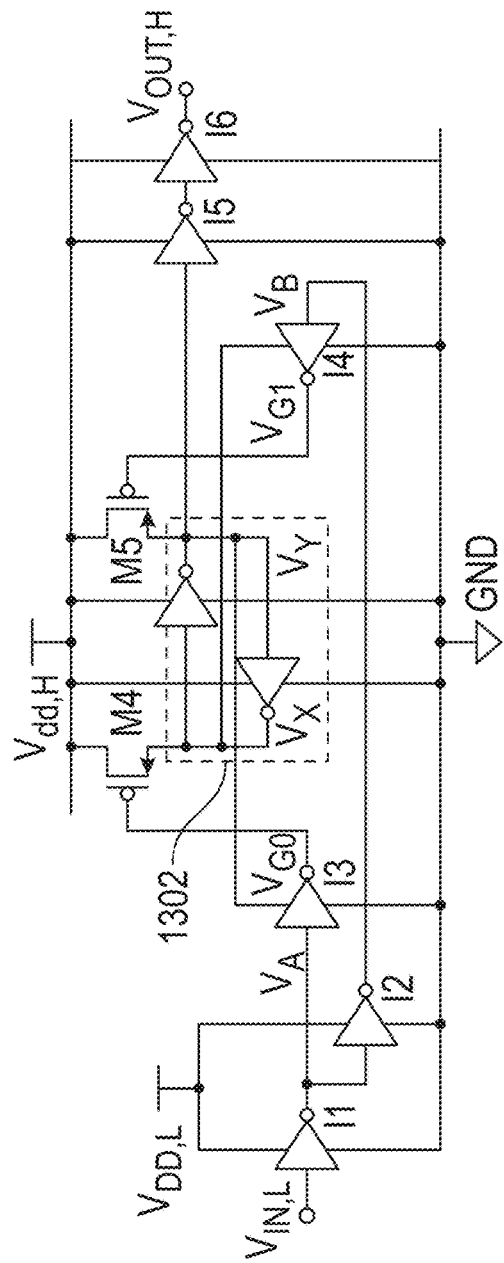
FIG. 13 depicts yet another embodiment of a low-to-high signal level converter.

FIG. 13 depicts an embodiment of a low-to-high signal level converter, similar to the embodiment in FIG. 12 but wherein the NMOS pull-down devices (M0 and M1) are not utilized. M0 and M1 are optional when cross-coupled inverters provide pull-down paths in the storage cell 1302. This embodiment may consume less circuit area and power but may operate somewhat slower than the embodiment of FIG. 12. This embodiment is another example of a common-source switch configuration.

Figure 14:
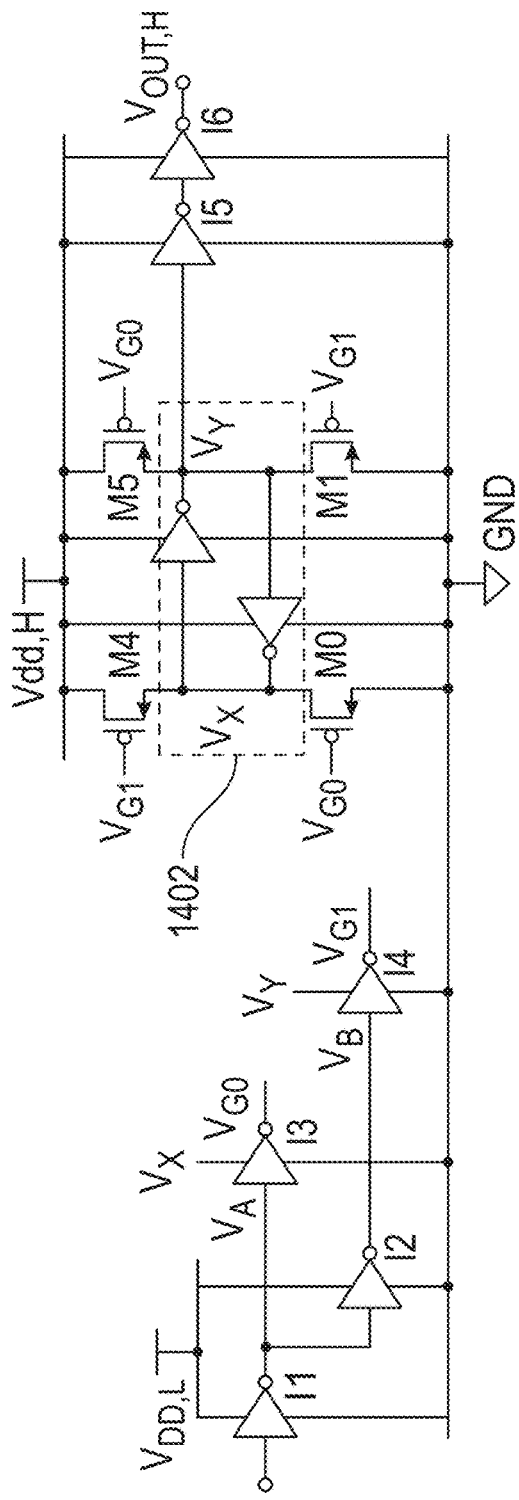
FIG. 14 depicts an embodiment of a low-to-high signal level converter utilizing cross-coupled inverters (which may be replaced with cross-coupled PMOS devices) as the storage cell 1402.

FIG. 14 depicts an embodiment of a low-to-high signal level converter utilizing cross-coupled inverters (which may be replaced with cross-coupled PMOS devices) as the storage cell 1402. Also utilized are control drivers I3 and I4 with moving $V_X$ and $V_Y$ supply voltages.

In this embodiment, PMOS devices are used for both pull-down (M0 and M1) and pull-up (M3 and M4) control on both storage nodes. This results in faster toggling because pull-up and pull-down paths are implemented on both sides of the storage element in addition to PMOS devices being utilized for both toggling transistors, enabling a maximum VSG of $V_{dd,H}$-0V being applied to each one. This embodiment is an example of a hybrid embodiment that utilizes pull-up PMOS devices in a common-source switch configurations and also utilizes pull-down PMOS devices in an inverted source-follower configuration.

Figure 15:
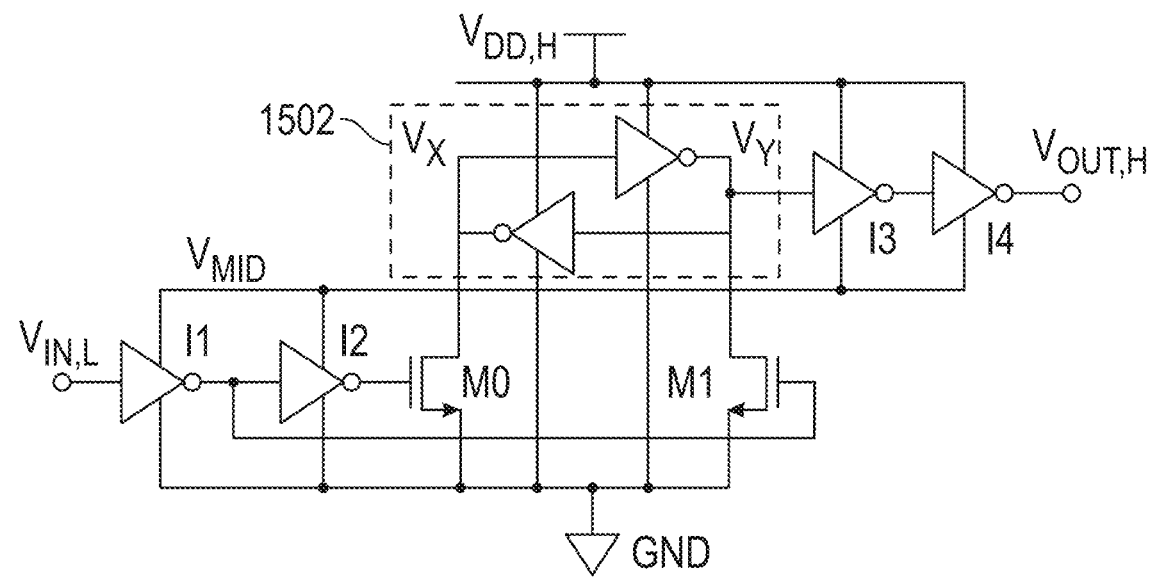
FIG. 15 depicts another embodiment of a low-to-high signal level converter utilizing cross-coupled inverters for the storage cell 1502.

FIG. 15 depicts another embodiment of a low-to-high signal level converter utilizing cross-coupled inverters for the storage cell 1502, providing additional NMOS pull-down transistors in the positive feedback path. This adds pull-down paths in the cross-coupled storage cell formed by the inverters. This embodiment is another example of a common-source switch configuration.

Figure 16:
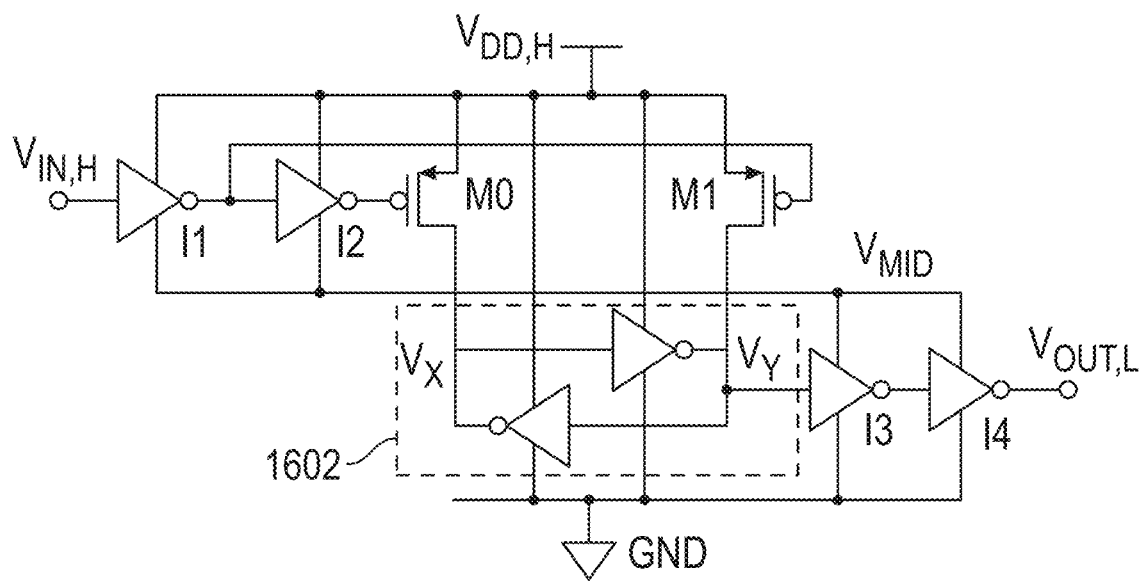
FIG. 16 depicts an embodiment of a high-to-low signal level converter utilizing cross-coupled inverters for the storage cell 1602.

FIG. 16 depicts an embodiment of a high-to-low signal level converter utilizing cross-coupled inverters for the storage cell 1602 and thereby providing additional PMOS pull-up transistors in the positive feedback path. This embodiment is an example of a common-source switch configuration utilized in a stacked voltage domain charge recycling circuit.

Figure 17:
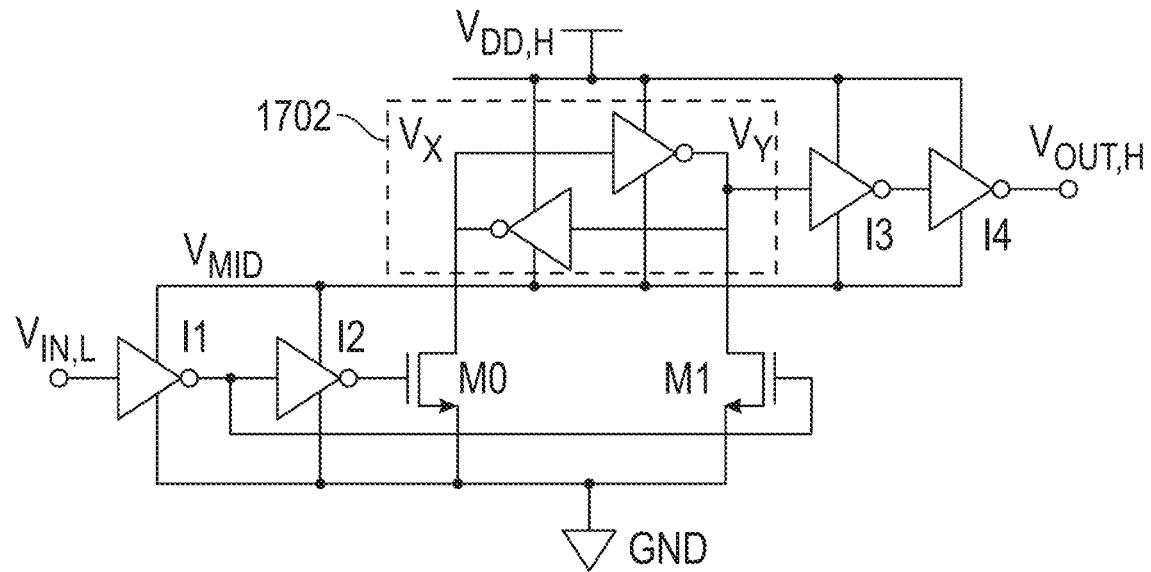
FIG. 17 depicts yet another embodiment of a low-to-high signal level converter utilizing cross-coupled inverters for the storage cell 1702.

FIG. 17 depicts yet another embodiment of a low-to-high signal level converter utilizing cross-coupled inverters for the storage cell 1702, wherein the negative supply of the cross-coupled inverters is connected to the $V_{MID}$ rail.

This embodiment limits the minimum voltage at the $V_X$ and $V_Y$ nodes to a neighborhood of $V_{MID}$. Because NMOS devices are used as the pull-down transistors (M0 and M1), they continue to try to pull the $V_X$ or $V_Y$ node to GND, while the cross-coupled inverters try to pull the same node to $V_{MID}$. This results in DC current being pulled from the $V_{MID}$ node, and the $V_X$ and $V_Y$ nodes being pulled somewhat below $V_{MID}$. This embodiment is another example of a common-source switch configuration utilized in a stacked voltage domain charge recycling circuit.

Figure 18:
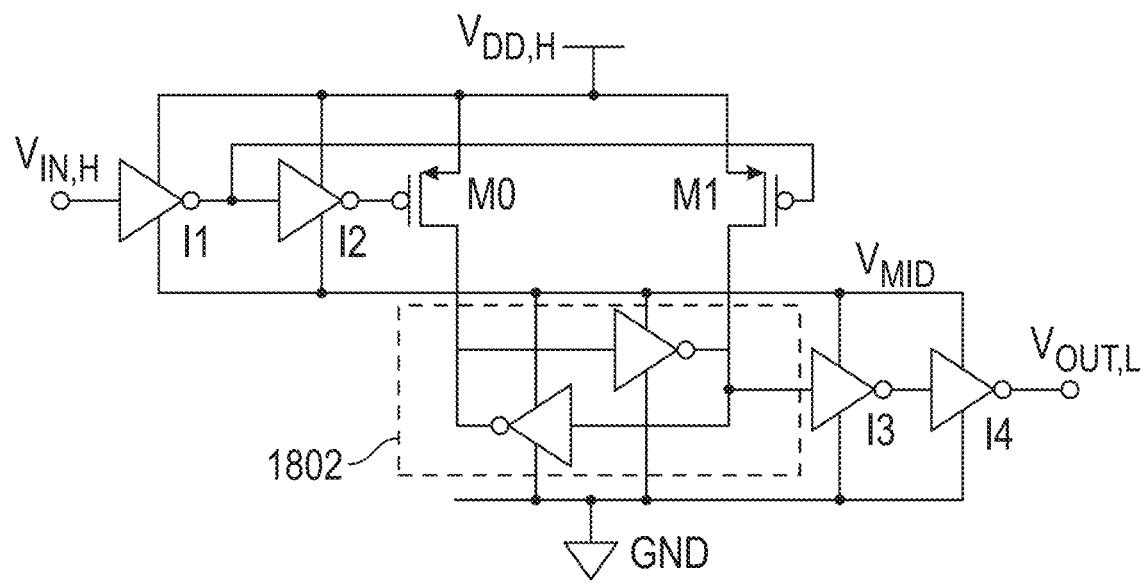
FIG. 18 depicts yet another embodiment of a high-to-low signal level converter utilizing cross-coupled inverters for the storage cell 1802.

FIG. 18 depicts yet another embodiment of a high-to-low signal level converter utilizing cross-coupled inverters for the storage cell 1802, wherein the supplies of the cross-coupled inverters are connected to $V_{MID}$ instead of $V_{dd}$.

This limits the maximum voltage swing of the $V_X$ and $V_Y$ nodes to be slightly above $V_{MID}$ because the pull-up transistors M0 and M1 pull the node to $V_{dd}$ while the active PMOS device in the cross-coupled inverters pulls the node to $V_{MID}$. This results in DC current being pulled from the supply $V_{dd}$. This embodiment is another example of a common-source switch configuration utilized in a stacked voltage domain charge recycling circuit.

Figure 19:
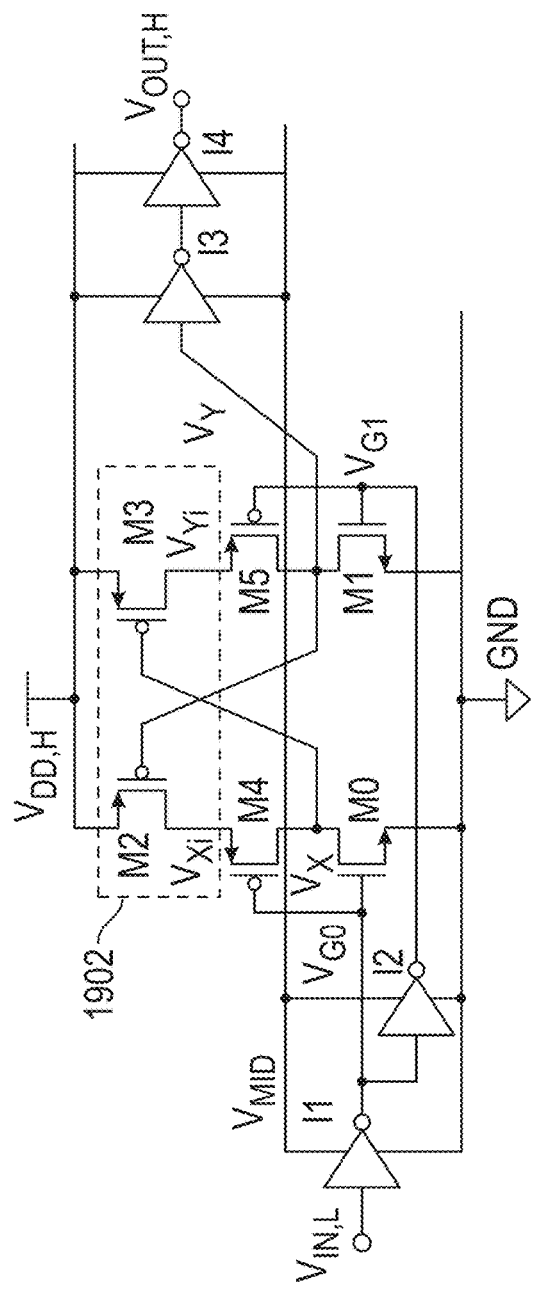
FIG. 19 depicts yet another embodiment of a low-to-high signal level converter.

FIG. 19 depicts yet another embodiment of a low-to-high signal level converter. This embodiment utilizes PMOS devices M4 and M5 to help isolate the switching nodes $V_X$ and $V_Y$ from the cross-coupled PMOS devices M2 and M3 whenever they are pulled to 0V. When M0 or M1 is activated to pull $V_X$ or $V_Y$ respectively to 0V, the corresponding PMOS transistor is turned off so that the pull-down devices do not have to overcome the cross-coupled storage cell 1902 above. Conversely, devices M4 and M5 connect $V_X$ to $V_{Xi}$, or $V_Y$ to $V_{Yi}$, respectively whenever the node is to be pulled high.

This helps to speed up the signal level transition. However devices M4 and M5 cannot be fully turned off, which may result in a long tail for $V_{Xi}$, or $V_{Yi}$, until these values settle to the gate voltage. This embodiment is another example of a common-source switch configuration utilized in a stacked voltage domain charge recycling circuit.

Figure 20:
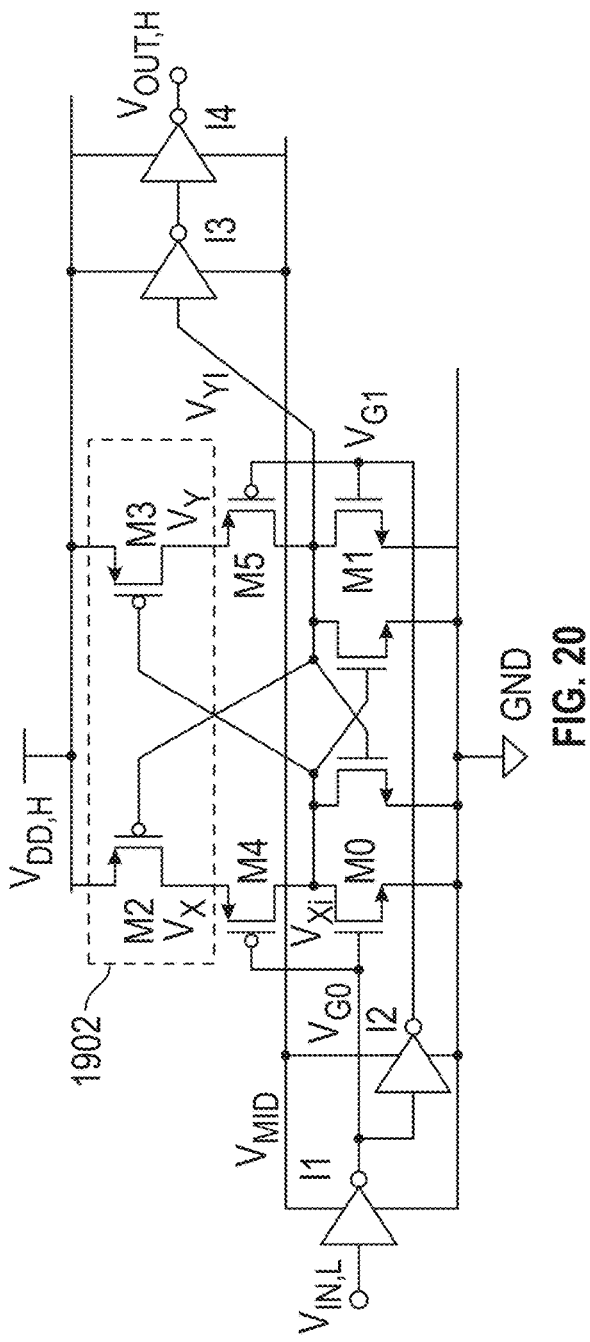
FIG. 20 depicts a low-to-high signal level converter embodiment similar to the one depicted in FIG. 19 with a cross-coupled NMOS structure added to the circuit.

FIG. 20 depicts an embodiment similar to the one depicted in FIG. 19 with a cross-coupled NMOS structure added to the circuit.

Figure 21:
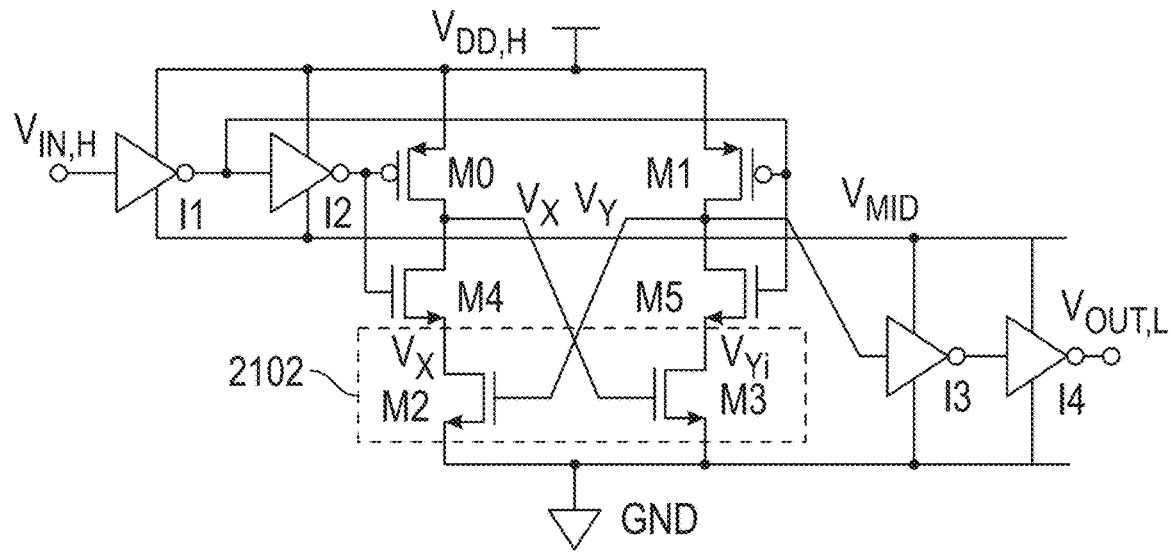
FIG. 21 depicts an embodiment of a high-to-low signal level converter.

FIG. 21 depicts an embodiment of a high-to-low signal level converter. M0 and M1 are pull-up devices in this embodiment. Whenever the internal state of the storage cell 2102 is toggled, NMOS devices M4 and M5 provide isolation from the cross-coupled NMOS devices M2 and M3. A cross-coupled PMOS structure may be added in another embodiment, similar to how the cross-coupled NMOS structure is disposed in the embodiment of FIG. 20. The embodiment depicted in FIG. 21 is another example of a common-source switch configuration utilized in a stacked voltage domain charge recycling circuit.

Figure 22:
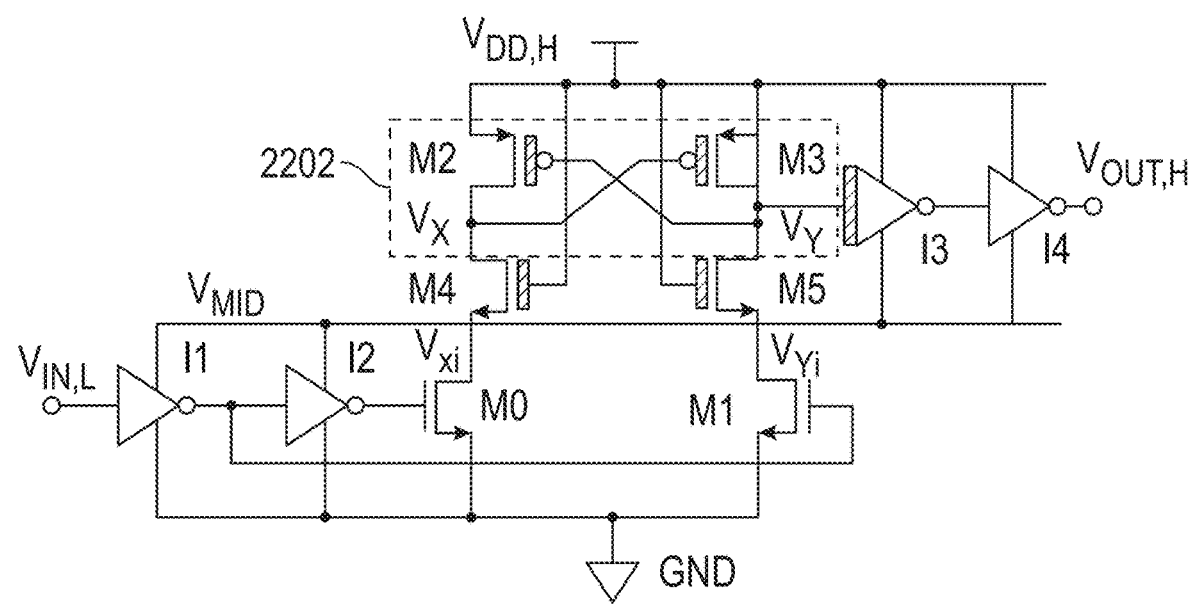
FIG. 22 depicts yet another embodiment of a low-to-high signal level converter.

FIG. 22 depicts yet another embodiment of a low-to-high signal level converter. The DC-biased NMOS transistors M4 and M5 serve as cascoded devices to limit the voltage swing on the $V_{Xi}$, and $V_{Yi}$, nodes of the storage cell 2202 when voltage compliance is a concern for pull-down transistors M0 and M1. This enables the use of faster, thin-oxide devices for M0 and M1 that are controlled by the $V_{MID}$-

GND (e.g., 0V) voltage domain, thus utilizing devices with smaller threshold voltages as the control signals.

$V_X$ and $V_Y$ are full-swing signals, while $V_{Xi}$, and $V_{Yi}$, are limited to a threshold voltage below the gate voltages of M4 and M5. In the depicted embodiment the gates of M4 and M5 are connected to the supply voltage $V_{dd}$, but more generally any DC bias voltage may be applied, including $V_{MID}$.

Buffer inverter I3 may also be formed using higher-voltage thick-oxide devices because the gate is subject to the full-swing signals $V_Y$.

This embodiment is another example of a common-source switch configuration utilized in a stacked voltage domain charge recycling circuit. In an alternate embodiment, the gates of M2 and M3 may connected to the $V_{Xi}$, and $V_{Yi}$, nodes, respectively.

Figure 23:
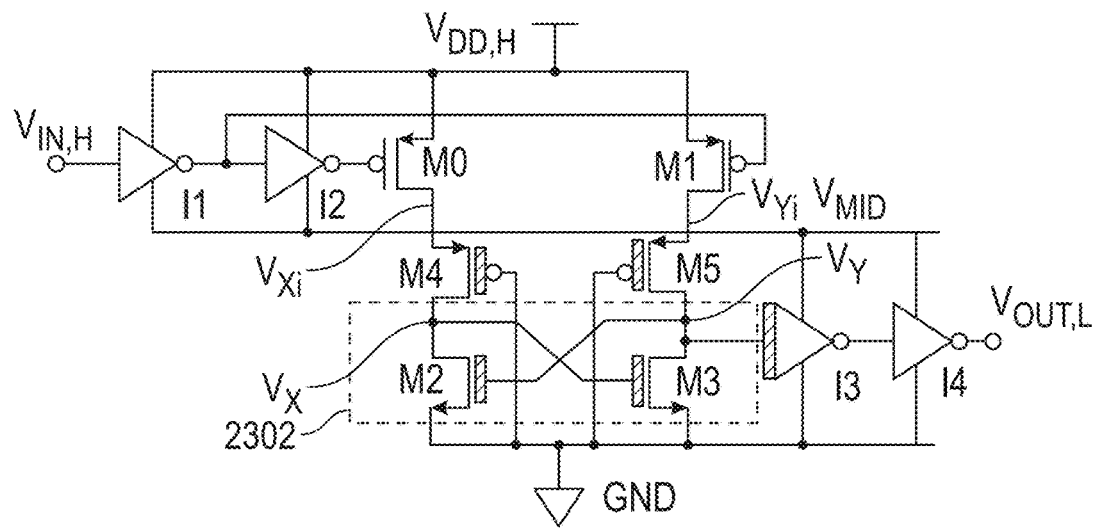
FIG. 23 depicts another embodiment of a high-to-low signal level converter.

FIG. 23 depicts an embodiment of a high-to-low signal level converter, wherein cascoded DC-biased PMOS transistors M4 and M5 serve to limit the voltage swing of the $V_{Xi}$, and $V_{Yi}$, nodes of the storage cell 2302 when voltage compliance is a concern for M0 and M1. This enables the use of faster, thin-oxide devices for M0 and M1 that are controlled by the $V_{dd}$-$V_{MID}$ voltage domain, thus utilizing devices with smaller threshold voltages as the control signals.

$V_X$ and $V_Y$ are full-swing signals, while $V_{Xi}$, and $V_{Yi}$, are limited to a threshold voltage above the gate voltages of M4 and M5.

The depicted embodiment connects the gates of cascoded devices M4 and M5 to ground (GND), but more generally any DC bias voltage may be utilized, including $V_{MID}$.

Buffer inverter I3 may also be formed with higher-voltage thick-oxide devices because the gate is subject to the full-swing signal $V_Y$.

This embodiment is another example of a common-source switch configuration utilized in a stacked voltage domain charge recycling circuit. In an alternate embodiment, the gates of M2 and M3 may connected to the $V_{Xi}$, and $V_{Yi}$, nodes, respectively.

Figure 24:
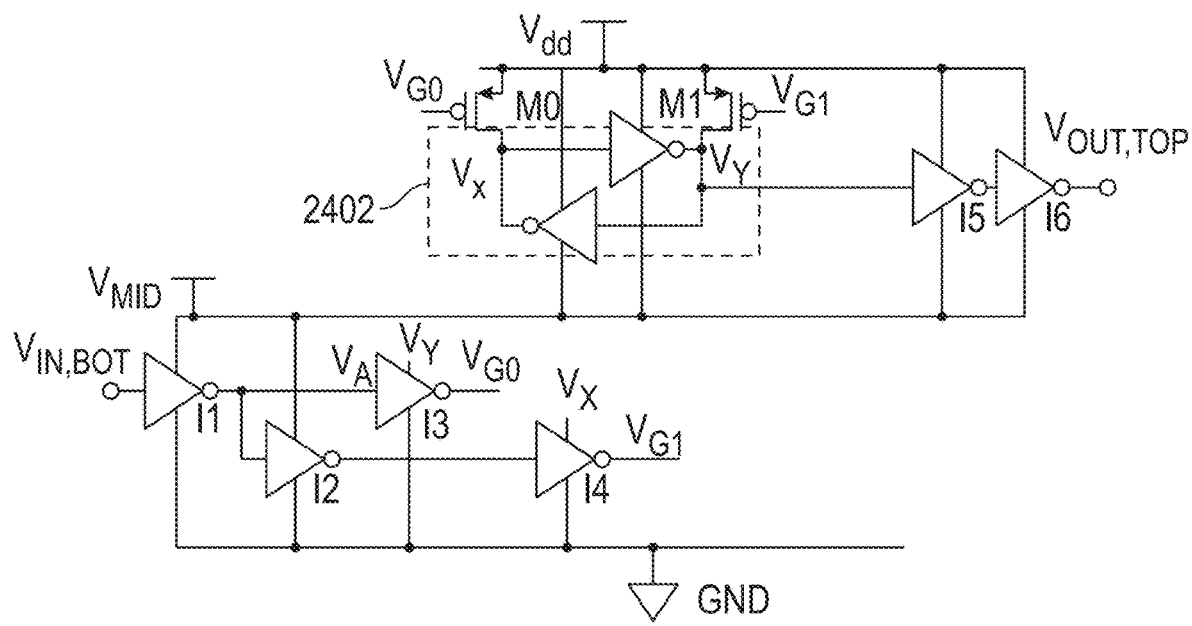
FIG. 24 depicts yet another embodiment of a low-to-high signal level converter.

FIG. 24 depicts yet another embodiment of a low-to-high signal level converter. Pull-up PMOS devices M0 and M1 are controlled by inverters I3 and I4, which have moving supply voltages provided by the nodes $V_X$ and $V_Y$ of the storage cell 2402. This enables pull-up paths with VSG's equal to the full supply range of $V_{dd}$-GND to maximize pull-up strength. This embodiment is another example of a common-source switch configuration utilized in a stacked voltage domain charge recycling circuit.

Figure 25:
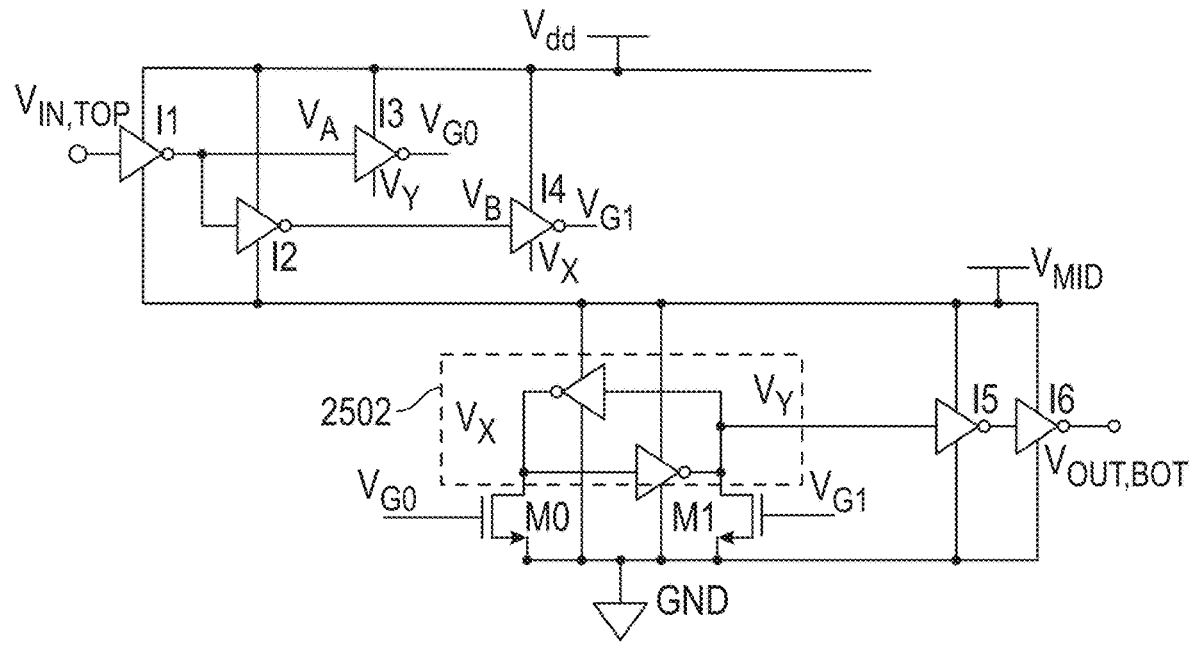
FIG. 25 depicts another embodiment of a high-to-low signal level converter.

FIG. 25 depicts an embodiment of a high-to-low signal level converter, wherein control drivers I3 and I4 utilize moving negative supplies (VSS) that are connected to the storage nodes $V_X$ and $V_Y$ of the storage cell 2502. Pull-down transistors M0 and M1 use NMOS devices to enable a VGS of VDD-GND to be applied for strong pull-down strength. This embodiment is another example of a common-source switch configuration utilized in a stacked voltage domain charge recycling circuit.

Figure 26:
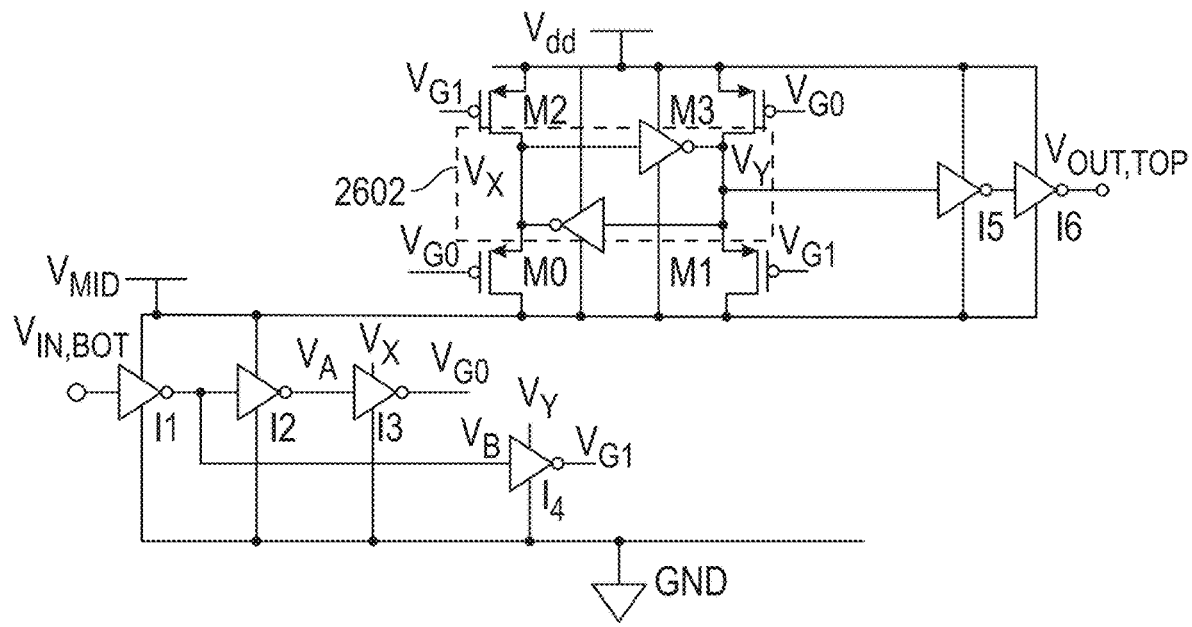
FIG. 26 depicts yet another embodiment of a low-to-high signal level converter.

FIG. 26 depicts yet another embodiment of a low-to-high signal level converter. In this embodiment, PMOS devices M0, M1, M2, M3 are used as pull-up and pull-down devices on both storage nodes of the storage cell 2602 to increase the toggling speed. Inverters I3 and I4 use moving supply voltages connected to $V_X$ and $V_Y$ to maximize the VSG's applied to the toggling transistors M0, M1, M2, and M3. This embodiment is an example of a hybrid embodiment that utilizes pull-up PMOS devices in a common-source switch configurations and also utilizes pull-down PMOS devices in an inverted source-follower configuration, in a stacked voltage domain charge recycling circuit.

Figure 27:
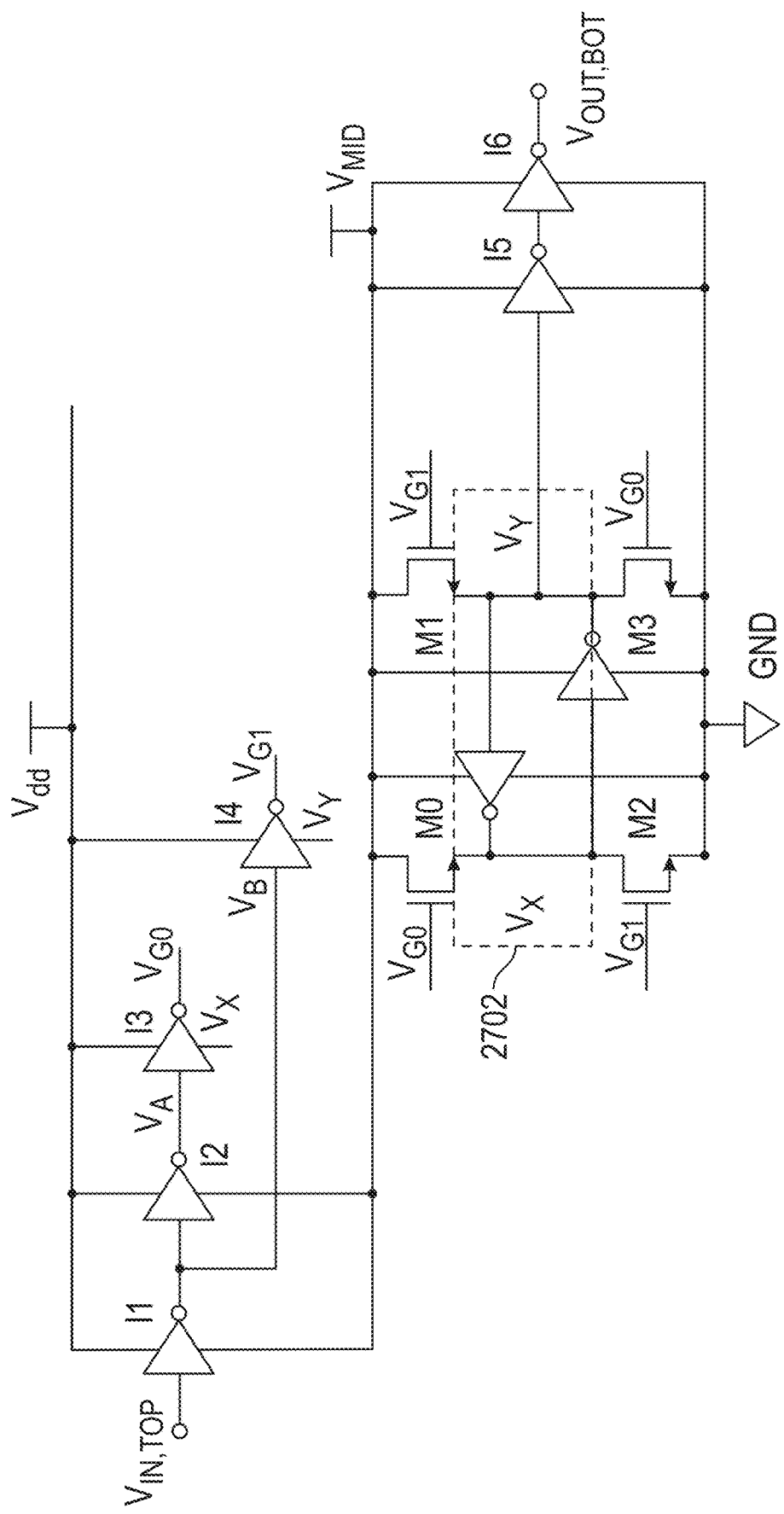
FIG. 27 depicts another embodiment of a high-to-low signal level converter.

FIG. 27 depicts an embodiment of a high-to-low signal level converter, wherein control drivers I3 and I4 have moving negative supplies (VSS) that are connected to the storage nodes $V_X$ and $V_Y$ of storage cell 2702. Pull-down and pull-up NMOS transistors M0, M1, M2, and M3 enable faster toggle transitions. This embodiment is an example of a hybrid embodiment that utilizes pull-down NMOS devices in a common-source switch configurations and also utilizes pull-up NMOS devices in an inverted source-follower configuration, in a stacked voltage domain charge recycling circuit.

LISTING OF DRAWING ELEMENTS 302 storage cell
402 VDD terminal
404 VSS terminal
406 storage cell
502 storage cell
602 storage cell
702 storage cell
802 storage cell
902 storage cell
1102 storage cell
1202 storage cell
1302 storage cell
1402 storage cell
1502 storage cell
1602 storage cell
1702 storage cell
1802 storage cell
1902 storage cell
2102 storage cell
2202 storage cell
2302 storage cell
2402 storage cell
2502 storage cell
2602 storage cell
2702 storage cell Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C. § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A stacked voltage domain level shifting circuit comprising:
   a storage cell powered by a mid-range supply rail of the stacked voltage domain level shifting circuit; and
   control drivers powered by moving supply voltages generated by the storage cell, the control drivers coupled to drive gates of common-source configured devices coupled to storage nodes of the storage cell.

2. The stacked voltage domain level shifting circuit of claim 1, wherein the storage cell comprises cross-coupled inverters.

3. The stacked voltage domain level shifting circuit of claim 2, wherein the mid-range supply rail powers positive supply terminals of the cross-coupled inverters.

4. The stacked voltage domain level shifting circuit of claim 2, wherein the mid-range supply rail powers negative supply terminals of the cross-coupled inverters.

5. The stacked voltage domain level shifting circuit of claim 1, wherein the moving supply voltages power positive supply terminals of the control drivers.

6. The stacked voltage domain level shifting circuit of claim 1, wherein the moving supply voltages power negative supply terminals of the control drivers.

7. The stacked voltage domain level shifting circuit of claim 1, wherein the common-source configured devices consist of a pair of PFET pull-up devices.

8. The stacked voltage domain level shifting circuit of claim 1, wherein the common-source configured devices consist of a pair of NFET pull-down devices.

9. The stacked voltage domain level shifting circuit of claim 1, further comprising:
   inverted-source-follower configured devices coupled to the storage nodes of the storage cell.

10. The stacked voltage domain level shifting circuit of claim 9, the inverted-source-follower configured devices consisting of a pair of PMOS pull-down devices.

11. The stacked voltage domain level shifting circuit of claim 9, the inverted-source-follower configured devices consisting of a pair of NMOS pull-up devices.

12. A stacked voltage domain level shifting circuit comprising:
   a storage cell powered by a mid-range supply rail of the stacked voltage domain level shifting circuit, the storage cell configured to generate a pair of moving supply voltages at a pair of storage nodes in response to a change in an input signal voltage level; and
   control drivers powered by moving supply voltages, the control drivers coupled to drive gates of common-source configured devices coupled to the pair of storage nodes.

13. The stacked voltage domain level shifting circuit of claim 12, wherein the storage cell comprises cross-coupled inverters.

14. The stacked voltage domain level shifting circuit of claim 13, wherein the mid-range supply rail powers positive supply terminals of the cross-coupled inverters.

15. The stacked voltage domain level shifting circuit of claim 13, wherein the mid-range supply rail powers negative supply terminals of the cross-coupled inverters.

16. The stacked voltage domain level shifting circuit of claim 12, wherein the moving supply voltages power positive supply terminals of the control drivers.

17. The stacked voltage domain level shifting circuit of claim 12, wherein the moving supply voltages power negative supply terminals of the control drivers.

18. A method for shifting a signal from a first voltage level to a second voltage level, the method comprising:
   powering a storage cell from a mid-range supply rail of a stacked voltage domain level shifting circuit to generate moving supply voltages at a pair of storage nodes of the storage cell in response to a change in an input signal voltage level; and
   powering control drivers with the moving supply voltages to drive gates of common-source configured devices coupled to the pair of storage nodes.

19. The method of claim 18, wherein the mid-range supply rail powers positive supply terminals of the storage cell.

20. The method of claim 18, wherein the mid-range supply rail powers negative supply terminals of the storage cell.

21. The method of claim 18, wherein the moving supply voltages power positive supply terminals of the control drivers.

22. The method of claim 18, wherein the moving supply voltages power negative supply terminals of the control drivers.

* * * * *